United States Patent
Hashimoto et al.

(10) Patent No.: US 8,785,333 B2
(45) Date of Patent: Jul. 22, 2014

(54) METHOD OF MANUFACTURING SEMICONDUCTOR DEVICE, SUBSTRATE PROCESSING APPARATUS, AND RECORDING MEDIUM

(71) Applicant: Hitachi Kokusai Electric Inc., Tokyo (JP)

(72) Inventors: Yoshitomo Hashimoto, Toyama (JP); Yoshiro Hirose, Toyama (JP); Satoshi Shimamoto, Toyama (JP); Atsushi Sano, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 13/973,714

(22) Filed: Aug. 22, 2013

(65) Prior Publication Data

US 2014/0057452 A1    Feb. 27, 2014

(30) Foreign Application Priority Data

Aug. 23, 2012  (JP) .................. 2012-184477

(51) Int. Cl.

| | |
|---|---|
| *H01L 21/31* | (2006.01) |
| *C23C 16/00* | (2006.01) |
| *H01L 21/02* | (2006.01) |
| *C23C 16/455* | (2006.01) |
| *C23C 16/30* | (2006.01) |
| *H01L 21/67* | (2006.01) |

(52) U.S. Cl.
CPC ...... *H01L 21/0214* (2013.01); *H01L 21/02219* (2013.01); *H01L 21/02211* (2013.01); *H01L 21/02274* (2013.01); *H01L 21/67017* (2013.01); *H01L 21/0228* (2013.01); *C23C 16/45531* (2013.01); *H01L 21/67109* (2013.01); *C23C 16/30* (2013.01); *H01L 21/0217* (2013.01); *H01L 21/02167* (2013.01)
USPC ............ 438/761; 438/778; 438/780; 118/715

(58) Field of Classification Search
USPC ......... 438/761, 763, 778, 780, 781, 790, 794; 118/715, 722
See application file for complete search history.

(56) References Cited

U.S. PATENT DOCUMENTS 8,288,294 B2 * 10/2012 Kafuku et al. ................ 438/778
(Continued)

FOREIGN PATENT DOCUMENTS

| JP | 2007-324536 A | 12/2007 |
|---|---|---|
| JP | 2011-521452 A | 7/2011 |

(Continued)

*Primary Examiner* — Kevin M Picardat
(74) *Attorney, Agent, or Firm* — Volpe and Koenig, P.C.

(57) ABSTRACT

A method of manufacturing a semiconductor device includes forming a thin film containing a predetermined element, carbon, nitrogen and a borazine ring skeleton on a substrate by performing a cycle for a first predetermined number of times. The cycle includes forming a first layer containing the predetermined element, a halogen group, carbon and nitrogen by supplying a first precursor gas containing the predetermined element and the halogen group and a second precursor gas containing the predetermined element and an amino group to the substrate, for a second predetermined number of times; and forming a second layer containing the predetermined element, carbon, nitrogen and the borazine ring skeleton by supplying a reaction gas containing a borazine compound to the substrate and allowing the first layer to react with the borazine compound to modify the first layer under a condition where the borazine ring skeleton in the borazine compound is maintained.

17 Claims, 15 Drawing Sheets

(56) References Cited

U.S. PATENT DOCUMENTS

2009/0232987 A1* 9/2009 Kumada et al. .......... 427/255.38
2011/0253991 A1* 10/2011 Oyamada et al. ............... 257/40
2013/0052836 A1 2/2013 Hirose et al.

FOREIGN PATENT DOCUMENTS

| WO | 2009/140094 A2 | 11/2009 |
| WO | 2011/123792 A2 | 10/2011 |
| WO | 2011/125395 A1 | 10/2011 |

* cited by examiner

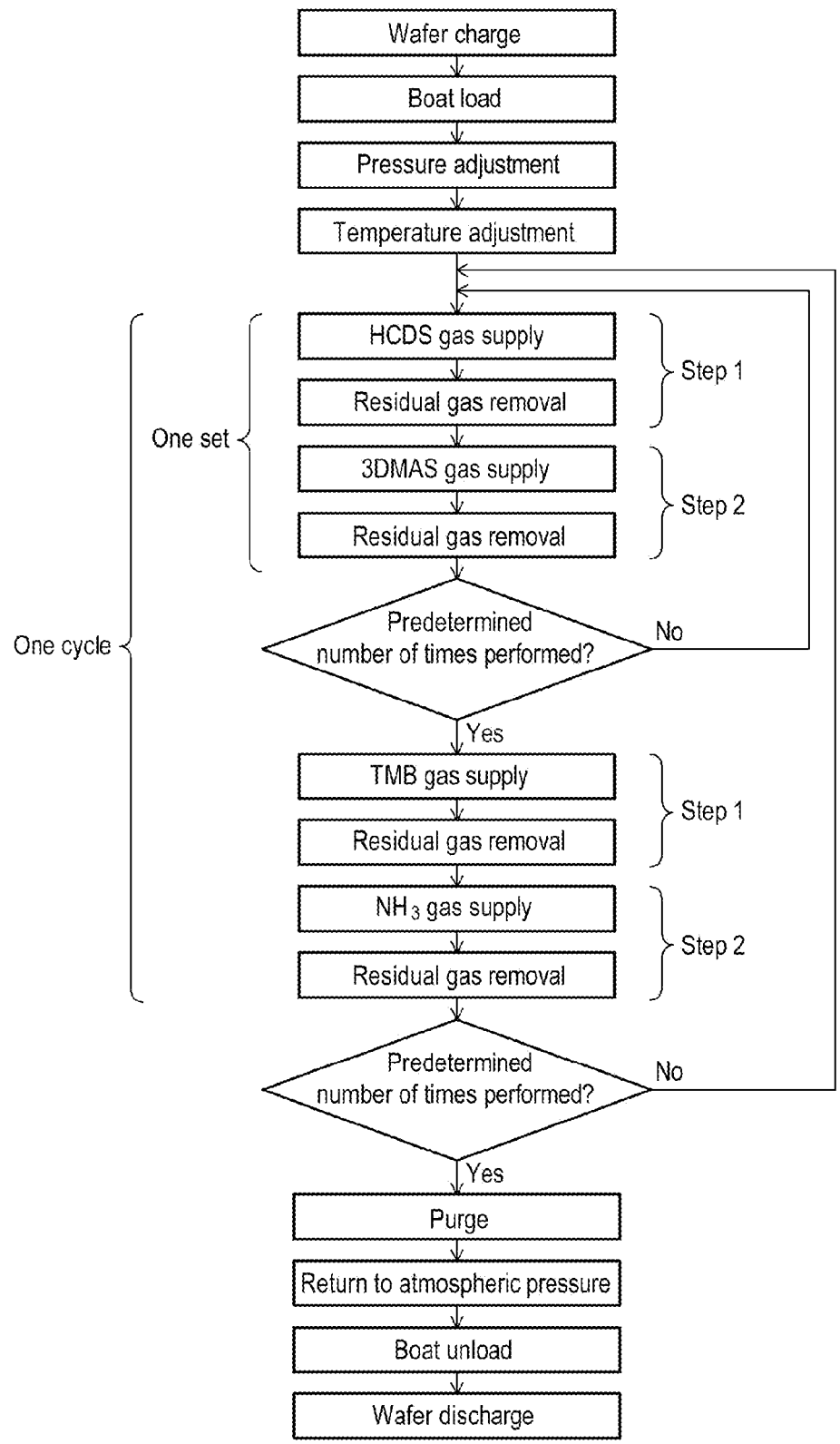

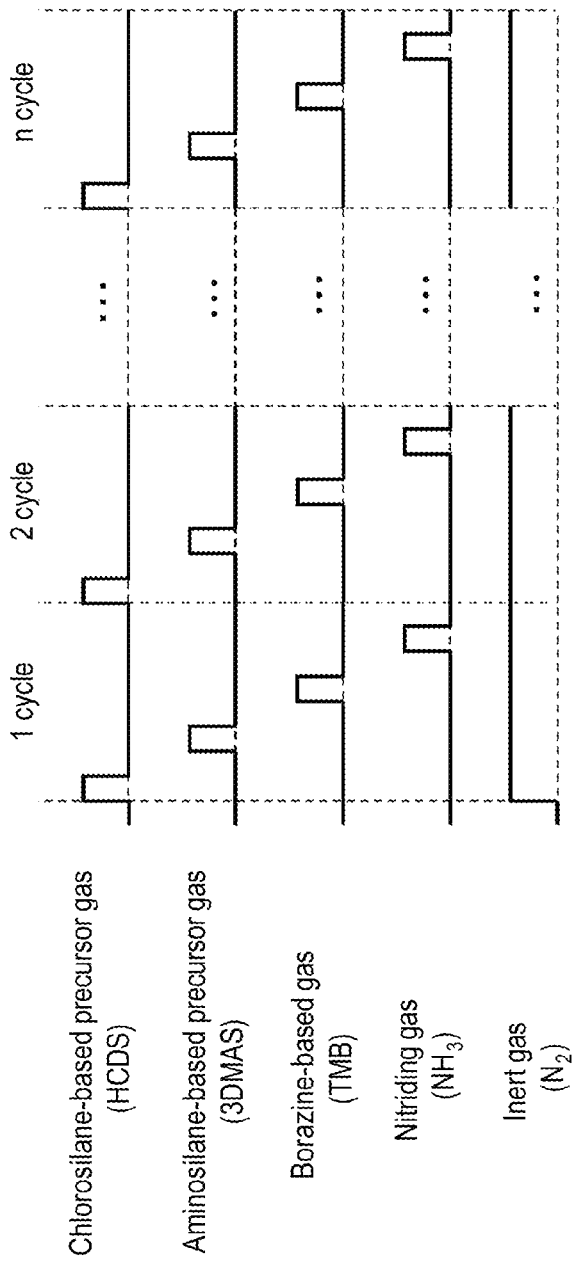

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is based upon and claims the benefit of priority from Japanese Patent Application No. 2012-184477, filed on Aug. 23, 2012, the entire contents of which are incorporated herein by reference.

TECHNICAL FIELD

The present disclosure relates to a method of manufacturing a semiconductor device which includes a process of forming a thin film on a substrate, a substrate processing apparatus, and a recording medium.

BACKGROUND

As transistors are miniaturized in size, a thin film such as an insulating film constituting a sidewall spacer (SWS) of a gate electrode requires a low film forming temperature, an improved resistance to hydrogen fluoride (HF), and a low dielectric constant. Thus, as the insulating film, a silicon carbonitride film (SiCN film) in which carbon (C) is added to a silicon nitride film (SiN film), a silicon oxycarbonitride film (SiOCN film) in which oxygen (O) is added to the silicon carbonitride film, or the like is used. In many cases, these insulating films are formed by an alternate supply method of alternately supplying different kinds of processing gases in that high step coverage property is required.

For the insulating film such as the above-described SiCN or SiOCN film, in order to further improve the resistance to HF, it is effective to reduce the oxygen concentration in the film by increasing the carbon concentration in the film. On the other hand, for such an insulating film, in order to further reduce the dielectric constant, it is effective to increase the oxygen concentration in the film by reducing the carbon concentration in the film. Recently, the demand for a film having an improved resistance to HF and a reduced dielectric constant, which are in a trade-off relationship, is increasing. However, it is difficult to satisfy the above-described demand for the film only by adjusting the composition of the SiCN film or SiOCN film, that is, by controlling the carbon concentration, the oxygen concentration, and the nitrogen concentration in the film. In addition, although a low film forming temperature is required when the insulating film constituting a sidewall spacer and the like is formed, the film forming temperature in the conventional alternate supply method is 600 degrees C. or so, and it was difficult to form the thin film such as the above-described insulating film in a low temperature range, for example, of 550 degrees C. or less.

SUMMARY

The present disclosure provides some embodiments of a method of manufacturing a semiconductor device, a substrate processing apparatus, and a recording medium, which make it possible to form a thin film having a high resistance to HF and a low dielectric constant in a low temperature range.

According to some embodiments of the present disclosure, there is provided a method of manufacturing a semiconductor device, including forming a thin film containing a predetermined element, carbon, nitrogen and a borazine ring skeleton on a substrate by performing a cycle for a first predetermined number of times, the cycle including: forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times; and forming a second layer containing the predetermined element, carbon, nitrogen and the borazine ring skeleton by supplying a reaction gas containing a borazine compound to the substrate and allowing the first layer to react with the borazine compound to modify the first layer under a condition in which the borazine ring skeleton in the borazine compound is maintained.

According to some other embodiments of the present disclosure, there is provided a substrate processing apparatus, including: a process chamber configured to accommodate a substrate; a heater configured to heat the substrate in the process chamber; a first precursor gas supply system configured to supply a first precursor gas containing a predetermined element and a halogen group to the substrate in the process chamber; a second precursor gas supply system configured to supply a second precursor gas containing the predetermined element and an amino group to the substrate in the process chamber; a reaction gas supply system configured to supply a reaction gas containing a borazine compound to the substrate in the process chamber; a pressure adjusting unit configured to adjust an internal pressure of the process chamber; and a control unit configured to control the first precursor gas supply system, the second precursor gas supply system, the reaction gas supply system, the heater and the pressure adjusting unit such that a thin film containing the predetermined element, carbon, nitrogen and a borazine ring skeleton is formed on the substrate by performing a cycle for a first predetermined number of times, the cycle including forming a first layer containing the predetermined element, the halogen group, carbon and nitrogen by performing supplying the first precursor gas to the substrate in the process chamber and supplying the second precursor gas to the substrate in the process chamber, for a second predetermined number of times, and forming a second layer containing the predetermined element, carbon, nitrogen and the borazine ring skeleton by supplying the reaction gas to the substrate in the process chamber and allowing the first layer to react with the borazine compound to modify the first layer under a condition in which the borazine ring skeleton in the borazine compound is maintained.

According to yet other embodiments of the present disclosure, there is provided a non-transitory computer-readable recording medium storing a program that causes a computer to perform a process of forming a thin film containing a predetermined element, carbon, nitrogen and a borazine ring skeleton on a substrate in a process chamber of a substrate processing apparatus by performing a cycle for a first predetermined number of times, the cycle including: forming a first layer containing the predetermined element, a halogen group, carbon and nitrogen by performing supplying a first precursor gas containing the predetermined element and the halogen group to the substrate in the process chamber and supplying a second precursor gas containing the predetermined element and an amino group to the substrate in the process chamber, for a second predetermined number of times; and forming a second layer containing the predetermined element, carbon, nitrogen and the borazine ring skeleton by supplying a reaction gas containing a borazine compound to the substrate in the process chamber and allowing the first layer to react with the borazine compound to modify the first layer under a condition in which the borazine ring skeleton in the borazine compound is maintained.

BRIEF DESCRIPTION OF THE DRAWINGS

FIG. 9 is a view illustrating a flow of film formation in a second sequence according to the second embodiment.

FIGS. 10A and 10B are views illustrating timings for gas supply and plasma power supply in the first sequence according to the second embodiment, wherein FIG. 10A shows an example of a sequence in which a film is formed under non-plasma conditions, and FIG. 10B shows an example of a sequence in which a film is formed using plasma.

FIGS. 11A and 11B are views illustrating timings for gas supply and plasma power supply in the second sequence according to the second embodiment, wherein FIG. 11A shows an example of a sequence in which a film is formed under non-plasma conditions, and FIG. 11B shows an example of a sequence in which a film is formed using plasma.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

<First Embodiment of Present Disclosure>

Hereinafter, a first embodiment of the present disclosure will be described with reference to the drawings.

(1) Configuration of Substrate Processing Apparatus

Figure 1:
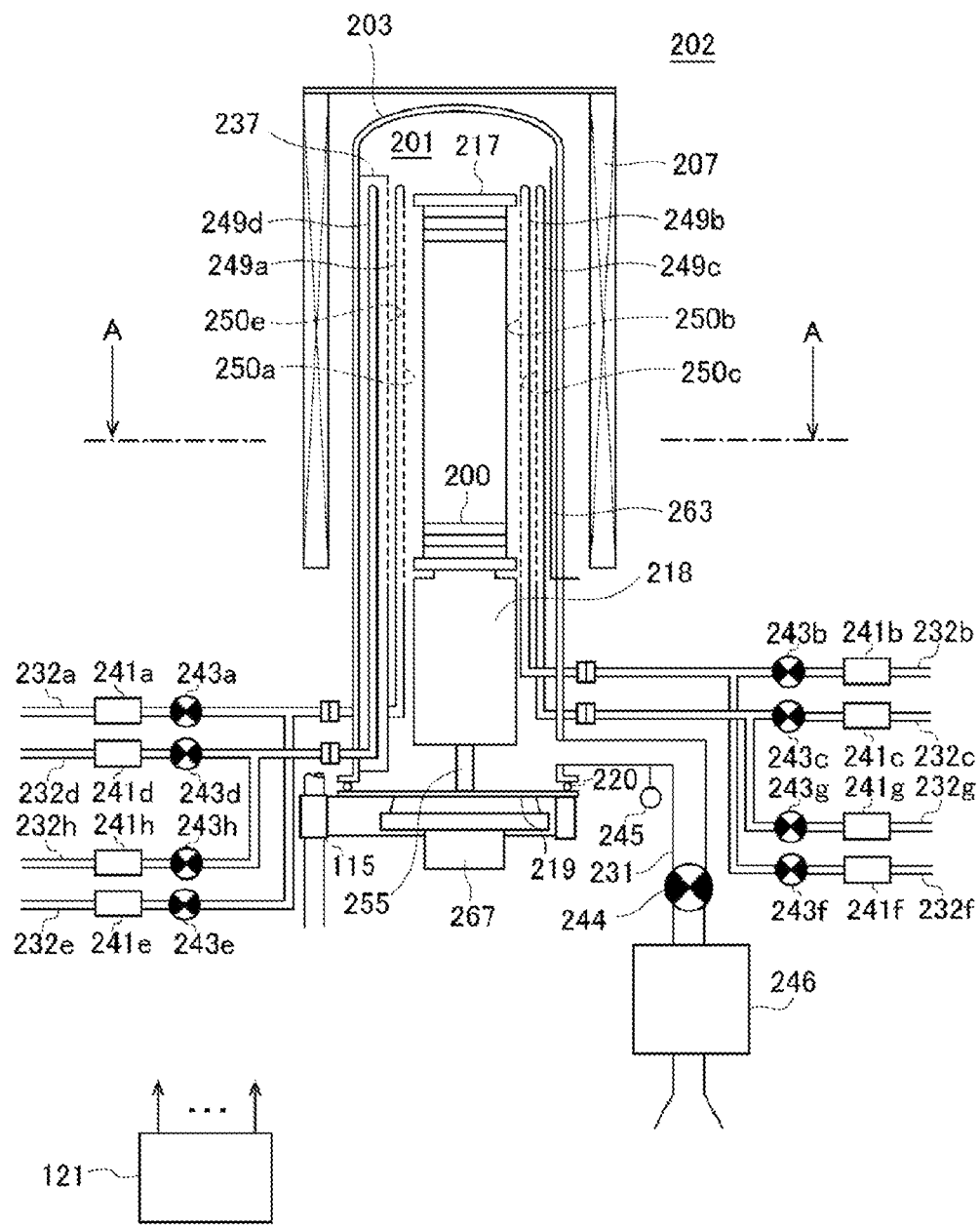
FIG. 1 is a schematic view illustrating a configuration of a vertical processing furnace of a substrate processing apparatus, in which a portion of the processing furnace is shown in a longitudinal sectional view, according to some embodiments of the present disclosure.
Figure 2:
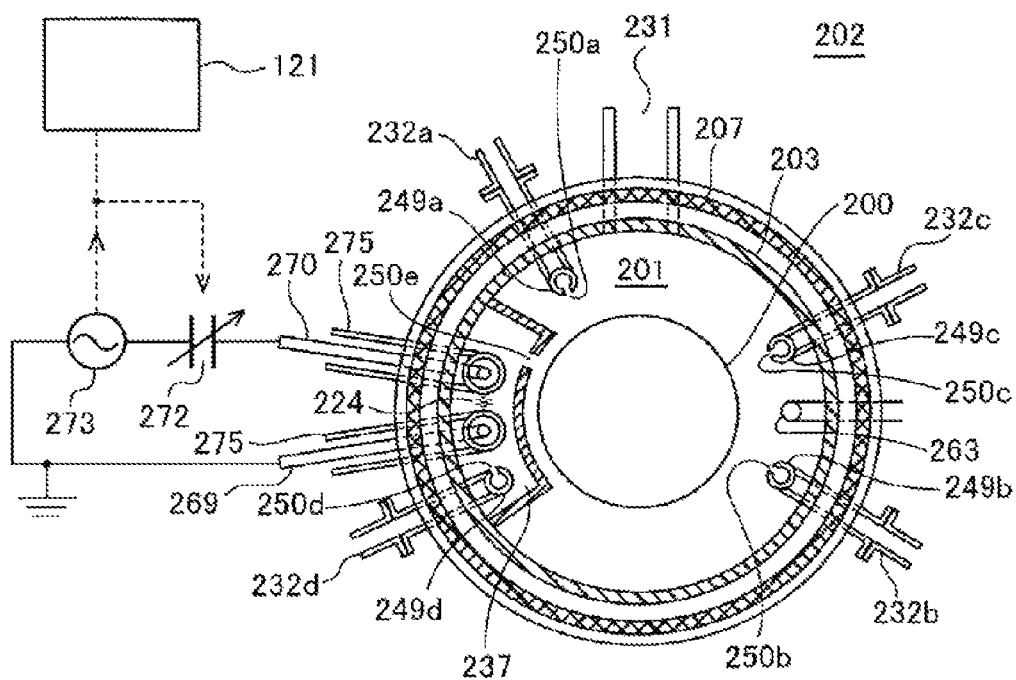
FIG. 2 is a schematic view illustrating a configuration of the vertical processing furnace of the substrate processing apparatus, in which a portion of the processing furnace is shown in a sectional view taken along line A-A in FIG. 1.

FIG. 1 is a schematic view illustrating a configuration of a vertical processing furnace 202 of a substrate processing apparatus, according to some embodiments, in which a portion of the processing furnace is shown in a longitudinal sectional view. FIG. 2 is a schematic view illustrating a configuration of the vertical processing furnace 202 of the substrate processing apparatus, according to some embodiments, in which a portion of the processing furnace 202 is shown in a sectional view taken along line A-A in FIG. 1. The present disclosure is not limited to the substrate processing apparatus according to these embodiments, but may be applied to other substrate processing apparatuses having a processing furnace of a single wafer type, a hot wall type, a cold wall type, and the like.

As shown in FIG. 1, the vertical processing furnace 202 includes a heater 207 as a heating unit (heating mechanism). The heater 207 has a cylindrical shape and is supported by a heater base (not shown) as a support plate so as to be vertically installed. The heater 207 acts as an activating mechanism to activate gas by heat, as described later.

A reaction tube 203 defining a reaction vessel (process vessel) is disposed inside the heater 207 in a concentric form along the heater 207. The reaction tube 203 is made of a heat resistant material such as quartz ($SiO_2$) or silicon carbide (SiC), and has a cylindrical shape with its upper end closed and its lower end opened. A process chamber 201 is provided in a hollow cylindrical portion of the reaction tube 203 and is configured to accommodate a plurality of wafers 200. The wafers 200 are horizontally stacked in multiple stages to be aligned in a vertical direction in a boat 217 described later.

A first nozzle 249a, a second nozzle 249b, a third nozzle 249c and a fourth nozzle 249d are provided in the process chamber 201 to penetrate through a lower portion of the reaction tube 203. The first nozzle 249a, the second nozzle 249b, the third nozzle 249c and the fourth nozzle 249d are respectively connected to a first gas supply pipe 232a, a second gas supply pipe 232b, a third gas supply pipe 232c and a fourth gas supply pipe 232d. In this way, the four nozzles 249a, 249b, 249c and 249d and the four gas supply pipes 232a, 232b, 232c and 232d are provided in the reaction tube 203 to allow several kinds of (four in this example) gases to be supplied into the process chamber 201.

Moreover, a manifold (not shown) formed of metal which supports the reaction tube 203 may be installed under the reaction tube 203 such that the nozzles penetrate through a sidewall of the metal manifold. In this case, an exhaust pipe 231 described later may be further installed at the metal manifold. Also, the exhaust pipe 231 may be installed at a lower portion of the reaction tube 203 rather than at the metal manifold. In this way, a furnace port of the processing furnace 202 may be formed of metal, and the nozzles may be mounted on the metal furnace port.

A mass flow controller (MFC) 241a, which is a flow rate controller (a flow rate control part), and a valve 243a, which is an opening/closing valve, are installed in the first gas supply pipe 232a in this order from an upstream direction. In addition, a first inert gas supply pipe 232e is connected to the first gas supply pipe 232a at a downstream side of the valve 243a. A mass flow controller 241e, which is a flow rate controller (a flow rate control part), and a valve 243e, which is an opening/closing valve, are installed at the first inert gas supply pipe 232e in this order from an upstream direction. In addition, the above-described first nozzle 249a is connected to a leading end portion of the first gas supply pipe 232a. The first nozzle 249a is installed in an arc-shaped space between an inner wall of the reaction tube 203 and the wafers 200. The first nozzle 249a is vertically disposed along the inner wall of the reaction tube 203 to rise upward in a stacking direction of the wafers 200. That is, the first nozzle 249a is installed at a side of a wafer arrangement region, in which the wafers 200 are arranged. The first nozzle 249a is configured as an L-shaped long nozzle, and has its horizontal portion installed to penetrate through a lower sidewall of the reaction tube 203 and its vertical portion installed to rise from one end portion of the wafer arrangement region toward the other end portion thereof. A plurality of gas supply holes 250a through which gas is supplied is formed in a side surface of the first nozzle 249a. The gas supply holes 250a are opened toward a center of the reaction tube 203 to supply gas toward the wafers 200. The gas supply holes 250a are disposed at a predetermined opening pitch from a lower portion to an upper portion of the reaction tube 203. The gas supply holes 250a have the same opening area. A first gas supply system is mainly configured by the first gas supply pipe 232a, the mass flow controller 241a and the valve 243a. The first nozzle 249a may also be included in the first gas supply system. In addition, a first inert gas supply system is mainly configured by the first inert gas supply pipe 232e, the mass flow controller 241e and the valve 243e. The first inert gas supply system also functions as a purge gas supply system.

A mass flow controller (MFC) 241b, which is a flow rate controller (a flow rate control part), and a valve 243b, which is an opening/closing valve, are installed in the second gas supply pipe 232b in this order from an upstream direction. In addition, a second inert gas supply pipe 232f is connected to the second gas supply pipe 232b at a downstream side of the valve 243b. A mass flow controller 241f, which is a flow rate controller (a flow rate control part), and a valve 243f, which is an opening/closing valve, are installed at the second inert gas supply pipe 232f in this order from an upstream direction. In addition, the above-described second nozzle 249b is connected to a leading end portion of the second gas supply pipe 232b. The second nozzle 249b is installed in an arc-shaped space between the inner wall of the reaction tube 203 and the wafers 200. The second nozzle 249b is vertically disposed along the inner wall of the reaction tube 203 to rise upward in the stacking direction of the wafers 200. That is, the second nozzle 249b is installed at the side of the wafer arrangement region, in which the wafers 200 are arranged. The second nozzle 249b is configured as an L-shaped long nozzle and has its horizontal portion installed to penetrate through the lower sidewall of the reaction tube 203 and its vertical portion installed to rise from one end portion of the wafer arrangement region toward the other end portion thereof. A plurality of gas supply holes 250b through which gas is supplied is formed in a side surface of the second nozzle 249b. The gas supply holes 250b are opened toward the center of the reaction tube 203 to supply gas toward the wafers 200. The gas supply holes 250b are disposed at a predetermined opening pitch from the lower portion to the upper portion of the reaction tube 203. The gas supply holes 250b have the same opening area. A second gas supply system is mainly configured by the second gas supply pipe 232b, the mass flow controller 241b and the valve 243b. The second nozzle 249b may also be included in the second gas supply system. In addition, a second inert gas supply system is mainly configured by the second inert gas supply pipe 232f, the mass flow controller 241f and the valve 243f. The second inert gas supply system also functions as a purge gas supply system.

A mass flow controller (MFC) 241c, which is a flow rate controller (a flow rate control part), and a valve 243c, which is an opening/closing valve, are installed in the third gas supply pipe 232c in this order from an upstream direction. In addition, a third inert gas supply pipe 232g is connected to the third gas supply pipe 232c at a downstream side of the valve 243c. A mass flow controller 241g, which is a flow rate controller (a flow rate control part), and a valve 243g, which is an opening/closing valve, are installed at the third inert gas supply pipe 232g in this order from an upstream direction. In addition, the above-described third nozzle 249c is connected to a leading end portion of the third gas supply pipe 232c. The third nozzle 249c is installed in an arc-shaped space between the inner wall of the reaction tube 203 and the wafers 200. The third nozzle 249c is vertically disposed along the inner wall of the reaction tube 203 to rise upward in the stacking direction of the wafers 200. That is, the third nozzle 249c is installed at the side of the wafer arrangement region, in which the wafers 200 are arranged, horizontally surrounding the wafer arrangement region along the wafer arrangement region. The third nozzle 249c is configured as an L-shaped long nozzle and has its horizontal portion installed to penetrate through the lower sidewall of the reaction tube 203 and its vertical portion installed to rise from at least one end portion of the wafer arrangement region toward the other end portion thereof. A plurality of gas supply holes 250c through which gas is supplied is formed in a side surface of the third nozzle 249c. The gas supply holes 250c are opened toward the center of the reaction tube 203 to supply gas toward the wafers 200. The gas supply holes 250c are disposed at a predetermined opening pitch from the lower portion to the upper portion of the reaction tube 203. The gas supply holes 250c have the same opening area. A third gas supply system is mainly configured by the third gas supply pipe 232c, the mass flow controller 241c and the valve 243c. The third nozzle 249c may also be included in the third gas supply system. In addition, a third inert gas supply system is mainly configured by the third inert gas supply pipe 232g, the mass flow controller 241g and the valve 243g. The third inert gas supply system also functions as a purge gas supply system.

A mass flow controller (MFC) 241d, which is a flow rate controller (a flow rate control part), and a valve 243d, which is an opening/closing valve, are installed in the fourth gas supply pipe 232d in this order from an upstream direction. In addition, a fourth inert gas supply pipe 232h is connected to the fourth gas supply pipe 232d at a downstream side of the valve 243d. A mass flow controller 241h, which is a flow rate controller (a flow rate control part), and a valve 243h, which is an opening/closing valve, are installed at the fourth inert gas supply pipe 232h in this order from an upstream direction. In addition, the above-described fourth nozzle 249d is connected to a leading end portion of the fourth gas supply pipe 232d. The fourth nozzle 249d is installed inside a buffer chamber 237 that is a gas diffusion space.

The buffer chamber 237 is installed in an arc-shaped space between the inner wall of the reaction tube 203 and the wafers 200. The buffer chamber 237 is vertically disposed along the inner wall of the reaction tube 203 in the stacking direction of the wafers 200. That is, the buffer chamber 237 is installed at the side of the wafer arrangement region, in which the wafers 200 are arranged. A plurality of gas supply holes 250e through which gas is supplied is formed in an end portion of a wall of the buffer chamber 237 adjacent to the wafers 200. The gas supply holes 250e are opened toward the center of the reaction tube 203 to supply gas toward the wafers 200. The gas supply holes 250e are disposed at a predetermined opening pitch from the lower portion to the upper portion of the reaction tube 203. The gas supply holes 250e have the same opening area.

The fourth nozzle 249d is installed along the inner wall of the reaction tube 203 to rise upward in the stacking direction of the wafers 200 in an end portion of the buffer chamber 237 opposite to the end portion thereof in which the gas supply holes 250e is formed. That is, the fourth nozzle 249d is installed at the side of the wafer arrangement region, in which the wafers 200 are arranged. The fourth nozzle 249d is configured as an L-shaped long nozzle and has its horizontal portion installed to penetrate through the lower sidewall of the reaction tube 203 and its vertical portion installed to rise from one end portion of the wafer arrangement region toward the other end portion thereof. A plurality of gas supply holes 250d through which gas is supplied is formed in a side surface of the fourth nozzle 249d. The gas supply holes 250d are opened toward the center of the buffer chamber 237. The gas supply holes 250d are disposed at a predetermined opening pitch from the lower portion to the upper portion of the reaction tube 203 in the same way as the gas supply holes 250e of the buffer chamber 237. The plurality of gas supply holes 250d may have the same opening area and the same opening pitch from an upstream side (lower portion) to an downstream side (upper portion) when a pressure difference between the interior of the buffer chamber 237 and the interior of the process chamber 201 is small. However, when the pressure difference is large, the opening area of each gas supply hole 250d may be set larger and the opening pitch of each gas supply hole 250d may be set smaller at the downstream side than the upstream side.

In the embodiment, by adjusting the opening area or opening pitch of each gas supply hole 250d of the fourth nozzle 249d from the upstream side to the downstream side as described above, gases may be ejected at an almost same flow rate from the respective gas supply holes 250d despite a flow velocity difference. In addition, the gases ejected from the respective gas supply holes 250d are first introduced into the buffer chamber 237, and a flow velocity difference of the gases is uniformized in the buffer chamber 237. That is, the gases ejected from the respective gas supply holes 250d of the fourth nozzle 249d into the buffer chamber 237 are mitigated in particle velocity of the respective gases in the buffer chamber 237, and then are ejected from the respective gas supply holes 250e of the buffer chamber 237 into the process chamber 201. Therefore, the gases ejected from the respective gas supply holes 250d of the fourth nozzle 249d into the buffer chamber 237 have a uniform flow rate and flow velocity when the gases are ejected from the respective gas supply holes 250e of the buffer chamber 237 into the process chamber 201.

A fourth gas supply system is mainly configured by the fourth gas supply pipe 232d, the mass flow controller 241d, and the valve 243d. Also, the fourth nozzle 249d and the buffer chamber 237 may be included in the fourth gas supply system. In addition, a fourth inert gas supply system is mainly configured by the fourth inert gas supply pipe 232h, the mass flow controller 241h, and the valve 243h. The fourth inert gas supply system also functions as a purge gas supply system.

In the method of supplying gas according to the embodiment, the gas may be transferred through the nozzles 249a, 249b, 249c and 249d and the buffer chamber 237 disposed in an arc-shaped longitudinal space defined by the inner wall of the reaction tube 203 and end portions of the stacked wafers 200. The gas is first ejected into the reaction tube 203 near the wafers 200 through the gas supply holes 250a, 250b, 250c, 250d and 250e opened in the nozzles 249a, 249b, 249c, and 249d and the buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, and thus, a film thickness of a thin film formed on each of the wafers 200 can be uniformized. In addition, a residual gas after the reaction flows toward an exhaust port, i.e., the exhaust pipe 231, but a flow direction of the residual gas is not limited to the vertical direction but may be appropriately adjusted by a position of the exhaust port.

As a first precursor containing a predetermined element and a halogen group, a chlorosilane-based precursor gas containing at least a silicon (Si) element and a chloro group, for example, is supplied from the first gas supply pipe 232a into the process chamber 201 through the mass flow controller 241a, the valve 243a and the first nozzle 249a. Here, the chlorosilane-based precursor refers to a silane-based precursor containing the chloro group and includes at least silicon (Si) and chlorine (Cl). That is, the chlorosilane-based precursor described herein may also be referred to as a kind of halide. When the term "precursor" is used herein, it may refer to "a liquid precursor in a liquid state," "a precursor gas obtained by vaporizing a liquid precursor in a liquid state," or both of them. Therefore, when the term "chlorosilane-based precursor" is used herein, it may refer to "a chlorosilane-based precursor in a liquid state," "a chlorosilane-based precursor gas," or both of them. A hexachlorodisilane ($Si_2Cl_6$, abbreviated to HCDS) gas, for example, may be used as the chlorosilane-based precursor gas. When a liquid precursor in a liquid state under normal temperature and pressure, such as HCDS, is used, the liquid precursor is vaporized by a vaporization system, such as a vaporizer or a bubbler, and supplied as a precursor gas (HCDS gas).

As a second precursor containing the predetermined element and an amino group (amine group), an aminosilane-based precursor gas containing at least a silicon (Si) element and the amino group, for example, is supplied from the second gas supply pipe 232b into the process chamber 201 through the mass flow controller 241b, the valve 243b and the second nozzle 249b. Here, the aminosilane-based precursor refers to a silane-based precursor containing the amino group (which may be a silane-based precursor containing an alkyl group such as methyl group, ethyl group or butyl group) and includes at least silicon (Si), carbon (C) and nitrogen (N). That is, the aminosilane-based precursor described herein may also be referred to as an organic-based precursor, or an organic aminosilane-based precursor. When the term "aminosilane-based precursor" is used herein, it may refer to "an aminosilane-based precursor in a liquid state," "an aminosilane-based precursor gas," or both of them. A tris(dimethylamino)silane ($Si[N(CH_3)_2]_3H$, abbreviated to 3DMAS) gas, for example, may be used as the aminosilane-based precursor gas. When a liquid precursor in a liquid state under normal temperature and pressure, such as 3DMAS, is used, the liquid precursor is vaporized by a vaporization system, such as a vaporizer or a bubbler, and supplied as a precursor gas (3DMAS gas).

As a reaction gas containing a borazine compound, an organic borazine-based gas (borazine-based gas) containing an alkylborazine compound which is an organic borazine compound, for example, is supplied from the third gas supply pipe 232c into the process chamber 201 through the mass flow controller 241c, the valve 243c and the third nozzle 249c.

Figure 12A:
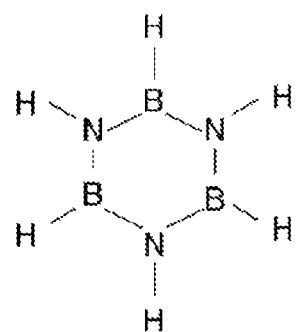
FIGS. 12A to 12D are views illustrating a chemical structural formula of borazine, a chemical structural formula of a borazine compound, a chemical structural formula of n,n',n''-trimethylborazine, and a chemical structural formula of n,n',n''-tri-n-propylborazine, respectively.
Figure 12B:
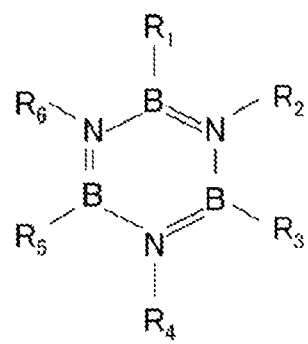

Here, the borazine compound is a heterocyclic compound consisting of boron, nitrogen and hydrogen. The borazine compound may be represented by a composition formula of $B_3H_6N_3$, and may be represented by a chemical structural formula shown in FIG. 12A. The borazine compound includes a borazine ring skeleton (referred to as "borazine skeleton") constituting a borazine ring consisting of three boron atoms (B) and three nitrogen atoms (N). The organic borazine compound is a borazine compound containing a carbon atom (C) and may also be referred to as a borazine compound containing a carbon-containing ligand. An alkylborazine compound is a borazine compound containing an alkyl group and may also be referred to as a borazine compound containing an alkyl group as a ligand. The alkylborazine compound is a compound in which at least any one of six hydrogen atoms (H) contained in the borazine compound is substituted with hydrocarbon containing one or more carbon atoms (C), and may be represented by the chemical structural formula shown in FIG. 12B. Here, $R_1$ to $R_6$ in the chemical structural formula shown in FIG. 12B are a hydrogen atom (H) or an alkyl group containing one to four carbon atoms (C). $R_1$ to $R_6$ may be the same alkyl group or different alkyl groups from each other. However, it is excluded that all of $R_1$ to $R_6$ are H. The alkylborazine compound may also be referred to as a substance having a borazine ring skeleton constituting a borazine ring and containing boron, nitrogen, hydrogen and carbon. Also, the alkylborazine compound may also be referred to as a substance having a borazine ring skeleton and containing an alkyl ligand. In addition, $R_1$ to $R_6$ may be a hydrogen atom (H), or an alkenyl group or alkynyl group containing one to four carbon atoms (C). $R_1$ to $R_6$ may be the same alkenyl group or alkynyl group, or different alkenyl groups or alkynyl groups from each other. However, not all of $R_1$ to $R_6$ should be H.

Figure 12C:
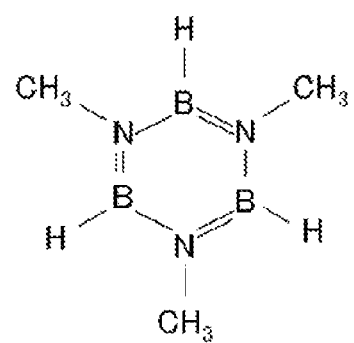

For example, n,n',n''-trimethylborazine (abbreviated to TMB) gas may be used as the reaction gas containing the borazine compound. TMB may be represented by the chemical structural formula shown in FIG. 12B wherein $R_1$, $R_3$ and $R_5$ are H and $R_2$, $R_4$ and $R_6$ are a methyl group (—$CH_3$), or a chemical structural formula shown in FIG. 12C. TMB may also be referred to as a borazine compound having a borazine ring skeleton and containing a methyl group as a ligand. When a borazine compound in a liquid state under normal temperature and pressure, such as TMB, is used, the borazine compound in a liquid state is vaporized by a vaporization system, such as a vaporizer or a bubbler, and supplied as a reaction gas containing a borazine compound (TMB gas).

A nitriding gas (nitrogen-containing gas), for example, is supplied from the fourth gas supply pipe 232d into the process chamber 201 through the mass flow controller 241d, the valve 243d, the fourth nozzle 249d and the buffer chamber 237. An ammonia ($NH_3$) gas, for example, may be used as the nitriding gas.

A nitrogen ($N_2$) gas, for example, is supplied from the inert gas supply pipes 232e, 232f, 232g and 232h into the process chamber 201 through the mass flow controllers 241e, 241f, 241g and 241h, the valves 243e, 243f, 243g and 243h, the gas supply pipes 232a, 232b, 232c and 232d, the nozzles 249a, 249b, 249c and 249d, and the buffer chamber 237, respectively.

Moreover, for example, when the above-described gases are allowed to flow through the respective gas supply pipes, a chlorosilane-based precursor gas supply system, which is a first precursor supply system (i.e., a first precursor gas supply system) for supplying the first precursor containing the predetermined element and the halogen group, is configured by the first gas supply system. In addition, an aminosilane-based precursor gas supply system, which is a second precursor supply system (i.e., a second precursor gas supply system) for supplying the second precursor containing the predetermined element and the amino group, is configured by the second gas supply system. Also, the chlorosilane-based precursor gas supply system and the aminosilane-based precursor gas supply system are also simply referred to as "a chlorosilane-based precursor supply system" and "an aminosilane-based precursor supply system," respectively. A reaction gas supply system, i.e., an organic borazine-based gas (borazine-based gas) supply system is also configured by the third gas supply system. In addition, a nitriding gas supply system is configured by the fourth gas supply system.

In the buffer chamber 237, as illustrated in FIG. 2, a first rod-shaped electrode 269 that is a first electrode having an elongated structure and a second rod-shaped electrode 270 that is a second electrode having an elongated structure are disposed to span from the lower portion to the upper portion of the reaction tube 203 in the stacking direction of the wafers 200. Each of the first rod-shaped electrode 269 and the second rod-shaped electrode 270 is disposed in parallel to the fourth nozzle 249d. Each of the first rod-shaped electrode 269 and the second rod-shaped electrode 270 is covered with and protected by an electrode protection tube 275, which is a protection tube for protecting each electrode from an upper portion to a lower portion thereof. Any one of the first rod-shaped electrode 269 and the second rod-shaped electrode 270 is connected to a high-frequency power source 273 through a matcher 272, and the other one is connected to a ground corresponding to a reference electric potential. By applying high-frequency power from the high-frequency power source 273 between the first rod-shaped electrode 269 and the second rod-shaped electrode 270 through the matcher 272, plasma is generated in a plasma generation region 224 between the first rod-shaped electrode 269 and the second rod-shaped electrode 270. A plasma source as a plasma generator (plasma generating part) is mainly configured by the first rod-shaped electrode 269, the second rod-shaped electrode 270, and the electrode protection tubes 275. The matcher 272 and the high-frequency power source 273 may also be included in the plasma source. Also, as described later, the plasma source functions as an activating mechanism (exciting part) that activates (excites) gas to plasma.

The electrode protection tube 275 has a structure in which each of the first rod-shaped electrode 269 and the second rod-shaped electrode 270 can be inserted into the buffer chamber 237 in a state where each of the first rod-shaped electrode 269 and the second rod-shaped electrode 270 is isolated from an internal atmosphere of the buffer chamber 237. Here, when an internal oxygen concentration of the electrode protection tube 275 is equal to an oxygen concentration in an ambient air (atmosphere), each of the first rod-shaped electrode 269 and the second rod-shaped electrode 270 inserted into the electrode protection tubes 275 is oxidized by the heat generated by the heater 207. Therefore, by charging the inside of the electrode protection tube 275 with an inert gas such as nitrogen gas, or by purging the inside of the electrode protection tube 275 with an inert gas such as nitrogen gas using an inert gas purging mechanism, the internal oxygen concentration of the electrode protection tube 275 decreases, thereby preventing oxidation of the first rod-shaped electrode 269 or the second rod-shaped electrode 270.

The exhaust pipe 231 for exhausting an internal atmosphere of the process chamber 201 is installed at the reaction tube 203. A vacuum exhaust device, for example, a vacuum pump 246, is connected to the exhaust pipe 231 through a pressure sensor 245, which is a pressure detector (pressure detecting part) for detecting an internal pressure of the process chamber 201, and an auto pressure controller (APC) valve 244, which is a pressure adjuster (pressure adjusting part). The APC valve 244 is configured to perform/stop vacuum exhaust in the process chamber 201 by opening/closing the valve with the actuated vacuum pump 246, and further to adjust the internal pressure of the process chamber 201 by adjusting a degree of the valve opening with the actuated vacuum pump 246. An exhaust system is mainly configured by the exhaust pipe 231, the APC valve 244, and the pressure sensor 245. Also, the vacuum pump 246 may be included in the exhaust system. The exhaust system is configured to adjust the degree of the valve opening of the APC valve 244 based on pressure information detected by the pressure sensor 245 while operating the vacuum pump 246 such that the internal pressure of the process chamber 201 is vacuum exhausted to a predetermined pressure (a vacuum level).

A seal cap 219, which functions as a furnace port cover configured to hermetically seal a lower end opening of the reaction tube 203, is installed under the reaction tube 203. The seal cap 219 is configured to contact the lower end of the reaction tube 203 from the below in the vertical direction. The seal cap 219, for example, may be formed of metal such as stainless and have a disc shape. An O-ring 220, which is a seal member in contact with the lower end portion of the reaction tube 203, is installed at an upper surface of the seal cap 219. A rotary mechanism 267 configured to rotate the boat 217, which is a substrate holder to be described later, is installed below the seal cap 219. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to be vertically elevated or lowered by a boat elevator 115, which is an elevation mechanism vertically disposed at the outside of the reaction tube 203. The boat elevator 115 is configured to enable the boat 217 to be loaded into or unloaded from the process chamber 201 by elevating or lowering the seal cap 219. That is, the boat elevator 115 is configured as a transfer device (transfer mechanism) that transfers the boat 217, i.e., the wafers 200, into and out of the process chamber 201.

The boat 217, which is used as a substrate support, is made of a heat resistant material such as quartz or silicon carbide and is configured to support a plurality of the wafers 200 horizontally stacked in multiple stages with the centers of the wafers 200 concentrically aligned. In addition, a heat insulating member 218 formed of a heat resistant material such as quartz or silicon carbide is installed at a lower portion of the boat 217 and configured such that the heat from the heater 207 cannot be transferred to the seal cap 219. In addition, the heat insulating member 218 may be configured by a plurality of heat insulating plates formed of a heat resistant material such as quartz or silicon carbide, and a heat insulating plate holder configured to support the heat insulating plates in a horizontal posture in a multi-stage manner.

A temperature sensor 263, which is a temperature detector, is installed in the reaction tube 203. Based on temperature information detected by the temperature sensor 263, an electric conduction state to the heater 207 is adjusted such that the interior of the process chamber 201 has a desired temperature distribution. The temperature sensor 263 is configured in an L-shape similar to the nozzles 249a, 249b, 249c and 249d and installed along the inner wall of the reaction tube 203.

Figure 3:
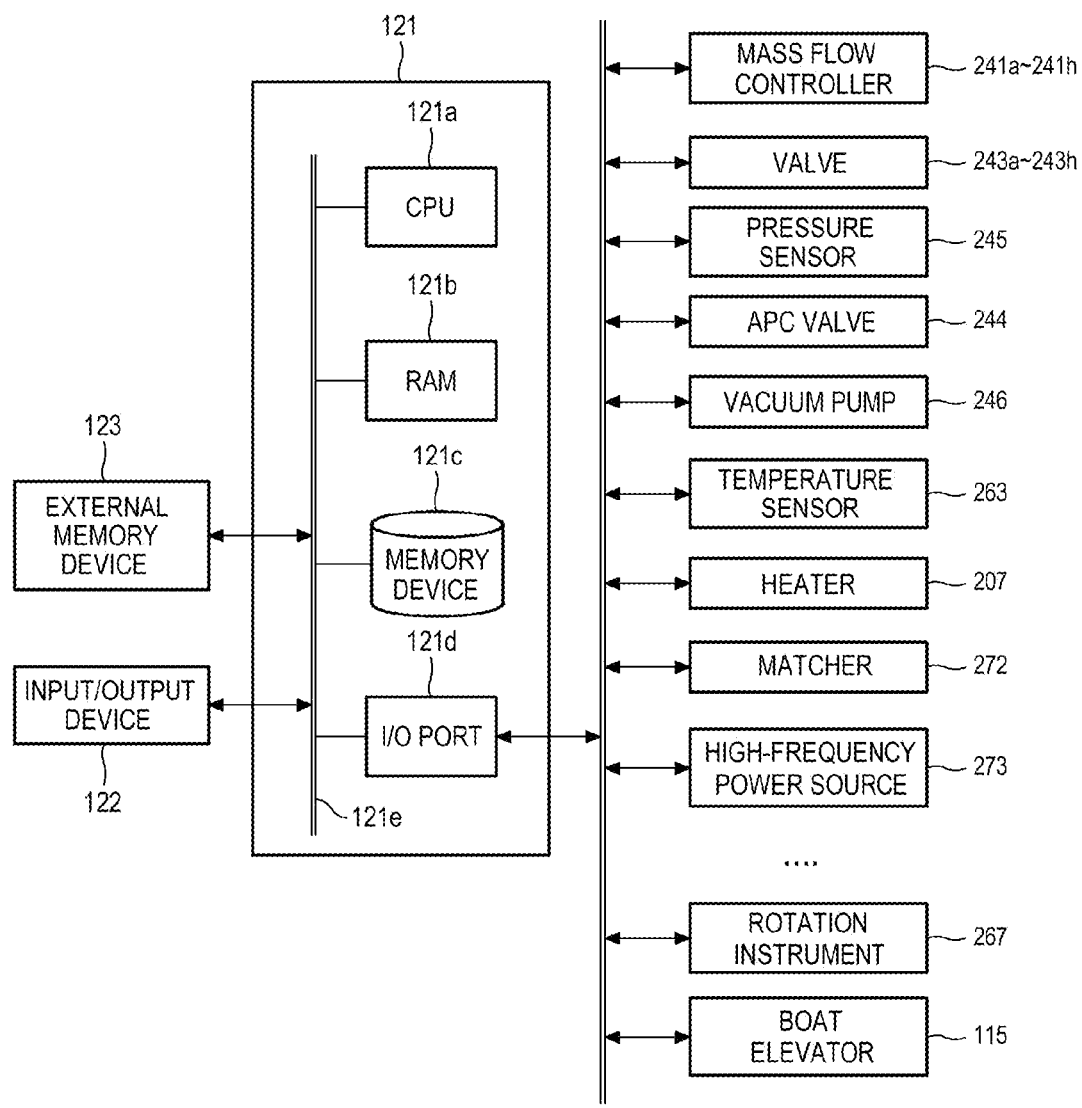
FIG. 3 is a schematic view illustrating a configuration of a controller of the substrate processing apparatus according to some embodiments of the present disclosure.

As illustrated in FIG. 3, a controller 121, which is a control unit (control part), is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured by, for example, a flash memory, a hard disc drive (HDD), or the like. A control program for controlling operations of the substrate processing apparatus or a process recipe, in which a sequence or condition for processing a substrate described later is written, is readably stored in the memory device 121c. Also, the process recipe functions as a program for the controller 121 to execute each sequence in the substrate processing process, which will be described later, to obtain a predetermined result. Hereinafter, the process recipe or control program may be generally referred to as "a program." Also, when the term "program" is used herein, it may include the case in which only the process recipe is included, the case in which only the control program is included, or the case in which both the process recipe and the control program are included. In addition, the RAM 121b is configured as a memory area (work area) in which a program or data read by the CPU 121a is temporarily stored.

The I/O port 121d is connected to the mass flow controllers 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the high-frequency power source 273, the matcher 272, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate controlling operation of various types of gases by the mass flow controllers 241a, 241b, 241c, 241d, 241e, 241f, 241g and 241h, the opening/closing operation of the valves 243a, 243b, 243c, 243d, 243e, 243f, 243g and 243h, the opening/closing operation of the APC valve 244 and the pressure adjusting operation by the APC valve 244 based on the pressure sensor 245, the operation of starting and stopping the vacuum pump 246, the temperature adjusting operation of the heater 207 based on the temperature sensor 263, the operation of supplying power by the high-frequency power source 273, the impedance adjusting operation of the matcher 272, the rotation and rotation speed adjusting operation of the boat 217 by the rotary mechanism 267, the elevation operation of the boat 217 by the boat elevator 115, and the like according to contents of the read process recipe.

Moreover, the controller 121 is not limited to being configured as a dedicated computer but may be configured as a general-purpose computer. For example, the controller 121 according to the embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 is configured as a non-transitory computer-readable recording medium. Hereinafter, these means for supplying the program will be simply referred to as "a recording medium." In addition, when the term "recording medium" is used herein, it may include a case in which only the memory device 121c is included, a case in which only the external memory device 123 is included, or a case in which both the memory device 121c and the external memory device 123 are included.

(2) Substrate Processing Process

Next, an example of a sequence of forming a thin film on a substrate, which is one of the processes of manufacturing a semiconductor device by using the processing furnace 202 of the above-described substrate processing apparatus, will be described. In addition, in the following description, operations of the respective parts constituting the substrate processing apparatus are controlled by the controller 121.

Moreover, in the embodiment, in order to form a composition ratio of a thin film to be formed as a stoichiometric composition or another predetermined composition ratio different from the stoichiometric composition, supply conditions of a plurality of kinds of gases containing a plurality of elements constituting the film to be formed are controlled. For example, the supply conditions are controlled such that at least one element of a plurality of elements constituting the thin film to be formed stoichiometrically exceeds another element. Hereinafter, an example of a sequence of forming a film while controlling a ratio of the plurality of elements constituting the thin film to be formed, i.e., a composition ratio of the film, will be described.

In a film formation sequence of the embodiment, a thin film containing a predetermined element, carbon, nitrogen and a borazine ring skeleton is formed on a substrate by performing a cycle a first predetermined number of times, the cycle including:

forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times, and forming a second layer containing the predetermined element, carbon, nitrogen and a borazine ring skeleton by supplying a reaction gas containing a borazine compound to the substrate and allowing the first layer to react with the borazine compound to modify the first layer under a condition in which the borazine ring skeleton in the borazine compound is maintained.

In the act of forming the first layer, for example, the process of supplying the first precursor gas and the process of supplying the second precursor gas may be alternately performed for a predetermined number of times. In other words, in the act of forming the first layer, the process of supplying the first precursor gas and the process of supplying the second precursor gas are set as one set and the set is then performed for a predetermined number of times. In addition, as described later, in the act of forming the first layer, the process of supplying the first precursor gas and the process of supplying the second precursor gas may be simultaneously performed for a predetermined number of times. Accordingly, in the act of forming the first layer, the first layer containing the predetermined element, the halogen group, carbon and nitrogen is formed.

Here, "the process of supplying the first precursor gas and the process of supplying the second precursor gas are alternately performed for a predetermined number of times" means that a process of supplying one of the first precursor gas and the second precursor gas and a process of supplying the other one of the first precursor gas and the second precursor gas are alternately performed once or multiple times. That is, it means that the respective processes are alternately performed one or more times.

In addition, "the process of supplying the first precursor gas and the process of supplying the second precursor gas are set as one set and the set is then performed for a predetermined number of times" means that a process of supplying one of the first precursor gas and the second precursor gas and a process of supplying the other one of the first precursor gas and the second precursor gas are set as one set and the set is then performed once or multiple times. That is, it means that such a set is performed one or more times. In addition, a case where the set is performed once corresponds to a first sequence described later, and a case where the set is performed multiple times, i.e., the set is repeated a plurality of times, corresponds to a second sequence which will be described.

In the act of forming the second layer, the first layer containing the predetermined element, the halogen group, carbon and nitrogen is allowed to react with the borazine compound. That is, the first layer containing the halogen group is allowed to react with the borazine compound. Specifically, the halogen group contained in the first layer is allowed to react with a ligand contained in the borazine compound. Accordingly, the halogen group contained in the first layer reacting with the ligand contained in the borazine compound is separated (extracted) from the first layer, and at the same time, the ligand contained in the borazine compound reacting with the halogen group contained in the first layer is separated from the borazine compound. Then, the borazine compound with the ligand separated therefrom is bonded to the predetermined element contained in the first layer. Specifically, a portion of a borazine ring of the borazine compound with the ligand separated therefrom is bonded to the predetermined element contained in the first layer. More specifically, nitrogen constituting the borazine ring of the borazine compound with the ligand separated therefrom is bonded to the predetermined element contained in the first layer.

In addition, "a cycle including forming a first layer and forming a second layer are performed for a predetermined number of times" means that when the act of forming the first layer and the act of forming the second layer are set as one cycle, the cycle is performed once or multiple times. That is, it means that such a cycle is performed one or more times. In other words, it may also mean that a cycle in which the act of forming the first layer and the act of forming the second layer are alternately performed is performed once or multiple times. However, it is preferable that this cycle be repeated a plurality of times.

Figure 4:
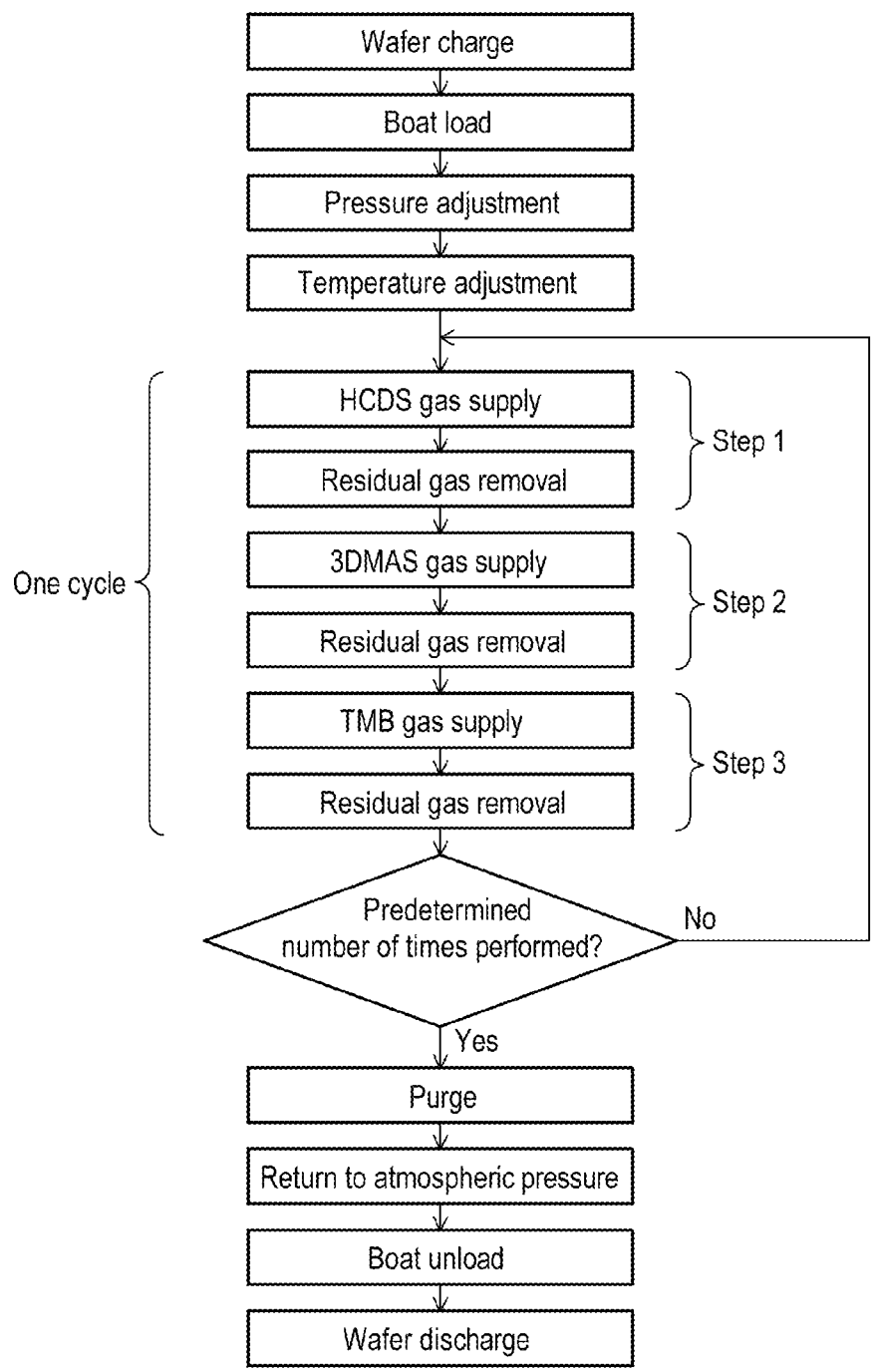
FIG. 4 is a view illustrating a flow of film formation in a first sequence according to a first embodiment.
Figure 6:
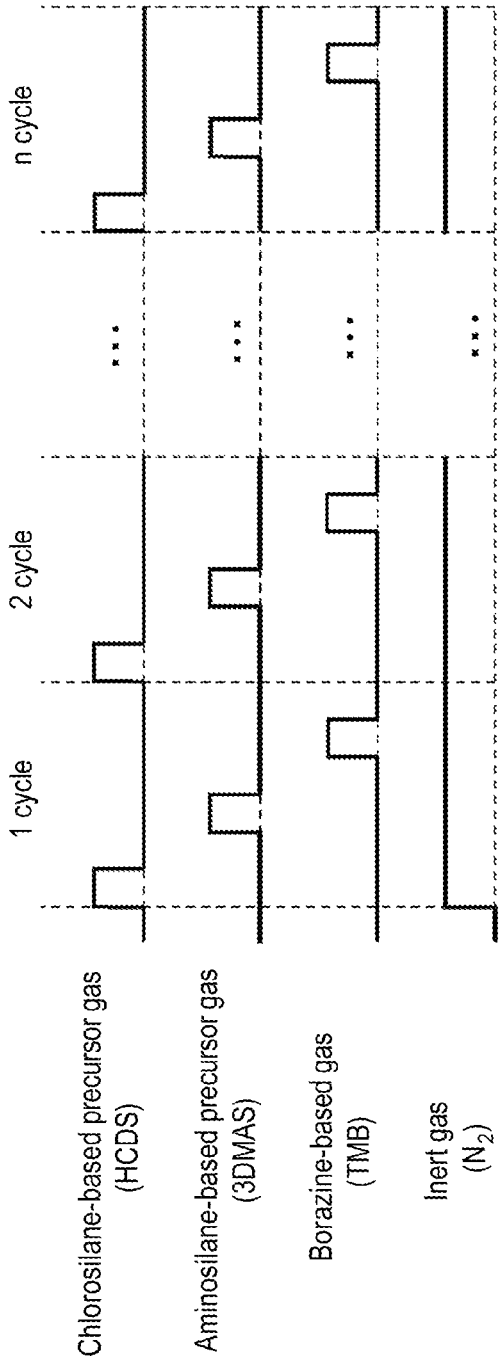
FIG. 6 is a view illustrating timings for gas supply in the first sequence according to the first embodiment.

In addition, in the embodiment, a wafer such as a silicon wafer which is a semiconductor substrate is used as the substrate. Also, a chlorosilane-based precursor gas containing silicon and a chloro group is used as the first precursor gas containing the predetermined element and the halogen group. Further, an aminosilane-based precursor gas containing silicon and an amino group is used as the second precursor gas containing the predetermined element and the amino group. Furthermore, a borazine compound gas having a borazine ring skeleton and containing an alkyl group (methyl group) as a ligand is used as the reaction gas containing the borazine compound. Moreover, a layer containing silicon, a chloro group (chlorine), carbon and nitrogen (silicon carbonitride layer containing chlorine) is formed as the first layer containing the predetermined element, the halogen group, carbon and nitrogen. Also, a layer containing silicon, carbon, nitrogen and a borazine ring skeleton (silicon borocarbonitride layer) is formed as the second layer containing the predetermined element, carbon, nitrogen and the borazine ring skeleton. A thin film containing silicon, carbon, nitrogen and a borazine ring skeleton (silicon borocarbonitride film) is also formed as the thin film containing the predetermined element, carbon, nitrogen and the borazine ring skeleton.
(First Sequence)
First, a first sequence of the embodiment will be described. FIG. 4 is a view illustrating a flow of film formation in the first sequence of the embodiment. FIG. 6 is a view illustrating timings for gas supply in the first sequence of the embodiment.

In the first sequence of the embodiment,
a silicon borocarbonitride film (hereinafter, referred to as "SiBCN film") containing a borazine ring skeleton as a thin film containing silicon, carbon, nitrogen and the borazine ring skeleton is formed on a wafer 200 by performing a cycle for a first predetermined number of times, the cycle including:

forming a silicon carbonitride layer containing chlorine (hereinafter, referred to as "SiCN layer containing Cl") as a first layer containing silicon, a chloro group (chlorine), carbon and nitrogen by performing supplying a chlorosilane-based precursor gas containing silicon and the chloro group to the wafer 200 in the process chamber 201 and supplying an aminosilane-based precursor gas containing silicon and an amino group to the wafer 200 in the process chamber 201, for a second predetermined number of times (once), and forming a silicon borocarbonitride layer (hereinafter, referred to as "SiBCN layer") containing the borazine ring skeleton as a second layer containing silicon, carbon, nitrogen and the borazine ring skeleton by supplying a reaction gas containing a borazine compound to the wafer 200 in the process chamber 201 and allowing the first layer to react with the borazine compound to modify the first layer under a condition in which the borazine ring skeleton in the borazine compound is maintained.

In addition, FIGS. 4 and 6 show an example of performing supplying the chlorosilane-based precursor gas to the wafer 200 in the process chamber 201 and then supplying the aminosilane-based precursor gas to the wafer 200 in the process chamber 201, i.e., an example of supplying the chlorosilane-based precursor gas prior to the aminosilane-based precursor gas, when the first layer is formed.

Moreover, when the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer, which is a laminated body."

Accordingly, "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

Moreover, the term "substrate" as used herein may be synonymous with the term "wafer," and in this case, the terms "wafer" and "substrate" may be used interchangeably in the above description.

Hereinafter, the first sequence of the embodiment will be described. Here, an HCDS gas is used as the chlorosilane-based precursor gas, the 3DMAS gas is used as the aminosilane-based precursor gas, and the TMB gas is used as the reaction gas containing the borazine compound, and the SiBCN film containing the borazine ring skeleton is formed on the wafer 200 according to the film formation flow of FIG. 4 and the film formation sequence of FIG. 6.

(Wafer Charging and Boat Loading)
When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the reaction tube 203 via the O-ring 220.

(Pressure Adjustment and Temperature Adjustment)
The interior of the process chamber 201 is vacuum exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). Also, the vacuum pump 246 maintains a regular operation state at least until processing of the wafers 200 is terminated. Further, the process chamber 201 is heated by the heater 207 to a desired temperature. Here, an electrical conduction state to the heater 207 is feedback-controlled based on the temperature information detected by the temperature sensor 263 until the interior of the process chamber 201 reaches a desired temperature distribution (temperature adjustment). In addition, the heating of the interior of the process chamber 201 by the heater 207 is continuously performed at least until processing of the wafers 200 is terminated. Next, the boat 217 and wafers 200 begin to be rotated by the rotary mechanism 267 (wafer rotation). Furthermore, the rotation of the boat 217 and wafers 200 by the rotary mechanism 267 is continuously performed at least until processing of the wafers 200 is terminated.

(Process of Forming Silicon Borocarbonitride Film)
Next, the following three steps, i.e., Steps 1 to 3, are sequentially performed.

[Step 1]
(HCDS Gas Supply)
The valve 243a of the first gas supply pipe 232a is opened to flow the HCDS gas into the first gas supply pipe 232a. A flow rate of the HCDS gas flowing into the first gas supply pipe 232a is adjusted by the mass flow controller 241a. The flow rate-adjusted HCDS gas is supplied into the process chamber 201 through the gas supply holes 250a of the first nozzle 249a, and exhausted through the exhaust pipe 231. In this way, the HCDS gas is supplied to the wafer 200 (HCDS gas supply). At the same time, the valve 243e is opened to flow an inert gas such as $N_2$ gas into the first inert gas supply pipe 232e. A flow rate of the $N_2$ gas flowing in the first inert gas supply pipe 232e is adjusted by the mass flow controller 241e. The flow rate-adjusted $N_2$ gas is supplied into the process chamber 201 together with the HCDS gas, and exhausted through the exhaust pipe 231. Here, in order to prevent infiltration of the HCDS gas into the second nozzle 249b, the third nozzle 249c, the fourth nozzle 249d and the buffer chamber 237, the valves 243f, 243g and 243h are opened to flow the $N_2$ gas into the second inert gas supply pipe 232f, the third inert gas supply pipe 232g, and the fourth inert gas supply pipe 232h. The $N_2$ gas is supplied into the process chamber 201 through the second gas supply pipe 232b, the third gas supply pipe 232c, the fourth gas supply pipe 232d, the second nozzle 249b, the third nozzle 249c, the fourth nozzle 249d and the buffer chamber 237, and exhausted through the exhaust pipe 231.

In this case, the APC valve 244 is appropriately adjusted to set the internal pressure of the process chamber 201 to fall within a range of, for example, 1 to 13300 Pa, or more specifically, for example, in a range of 20 to 1330 Pa. A supply flow rate of the HCDS gas controlled by the mass flow controller 241a is set to fall within a range of, for example, 1 to 1000 sccm. A supply flow rate of the $N_2$ gas controlled by each of the mass flow controllers 241e, 241f, 241g and 241h is set to fall within a range of, for example, 100 to 10000 sccm. A time of supplying the HCDS gas to the wafer 200, i.e., a gas supply time (irradiation time), is set to fall within a range of, for example, 1 to 120 seconds, or more specifically, for example, in a range of 1 to 60 seconds. At this time, a temperature of the heater 207 is set such that a temperature of the wafer 200 falls within a range of, for example, 250 to 700 degrees C., more specifically, for example, in a range of 300 to 650 degrees C., or further more specifically, for example, between 350 and 600 degrees C. When the temperature of the wafer 200 is less than 250 degrees C., it becomes difficult for the HCDS to be adsorbed onto the wafer 200 such that a practical film forming rate cannot be obtained. This problem can be solved by increasing the temperature of the wafer 200 to 250 degrees C. or more. Also, the HCDS can be more sufficiently adsorbed onto the wafer 200 by increasing the temperature of the wafer 200 to 300 degrees C. or more, or 350 degrees C. or more, and a more sufficient film forming rate can be obtained. Further, when the temperature of the wafer 200 exceeds 700 degrees C., the film thickness uniformity may be easily deteriorated to make it difficult to control the film thickness uniformity as a CVD reaction is strengthened (i.e., a gaseous reaction becomes dominant). By regulating the temperature of the wafer 200 to 700 degrees C. or less, deterioration of the film thickness uniformity can be suppressed, and thus, it is possible to control the film thickness uniformity. In particular, a surface reaction becomes dominant by setting the temperature of the wafer 200 to 650 degrees C. or less, more specifically, for example, 600 degrees C. or less, the film thickness uniformity can be easily secured, and thus, it becomes easy to control the film thickness uniformity. Accordingly, the temperature of the wafer 200 may be set to fall within a range of, for example, 250 to 700 degrees C., specifically, for example, 300 to 650 degrees C., or more specifically, for example, 350 to 600 degrees C.

As the HCDS gas is supplied to the wafer 200 under the above-described conditions, for example, a silicon-containing layer containing chlorine (Cl) having a thickness of less than one atomic layer to several atomic layers is formed on the wafer 200. The silicon-containing layer containing chlorine (Cl) may be an adsorption layer of the HCDS gas, a silicon layer (Si layer) containing Cl, or both of these.

Here, the silicon layer containing Cl is a generic name including a discontinuous layer in addition to a continuous layer formed of silicon (Si) and containing Cl, or a silicon thin film containing Cl formed by laminating them. Also, a continuous layer formed of Si and containing Cl may be referred to as the silicon thin film containing Cl. In addition, Si constituting the silicon layer containing Cl includes Si, in which bonding to Cl is completely broken, in addition to Si, in which bonding to Cl is not completely broken.

Moreover, the adsorption layer of the HCDS gas may include a chemisorption layer in which gas molecules of the HCDS gas are discontinuous, in addition to a chemisorption layer in which the gas molecules of the HCDS gas are continuous. That is, the adsorption layer of the HCDS gas may include a chemisorption layer that contains HCDS molecules having a thickness of one molecular layer or less. Further, HCDS ($Si_2Cl_6$) molecules constituting the adsorption layer of the HCDS gas also contains molecules in which bonding of Si and Cl is partially broken ($Si_xCl_y$ molecules). That is, the adsorption layer of the HCDS gas includes a chemisorption layer in which $Si_2Cl_6$ molecules and/or $Si_xCl_y$ molecules are continuous or a chemisorption layer in which $Si_2Cl_6$ molecules and/or $Si_xCl_y$ molecules are discontinuous.

Also, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer.

Under a condition in which the HCDS gas is autolyzed (pyrolyzed), i.e., under a condition in which a pyrolysis reaction of the HCDS gas occurs, the silicon layer containing Cl is formed by depositing Si on the wafer 200. Under a condition in which the HCDS gas is not autolyzed (pyrolyzed) (i.e., under a condition in which a pyrolysis reaction of the HCDS gas does not occur), the adsorption layer of the HCDS gas is formed by adsorbing the HCDS gas onto the wafer 200. In addition, the formation of the silicon layer containing Cl on the wafer 200 results in a higher film forming rate than the formation of the adsorption layer of the HCDS gas on the wafer 200.

When the thickness of the silicon-containing layer containing Cl formed on the wafer 200 exceeds several atomic layers, an effect of the modification reaction in Steps 2 and 3 described later is not applied to the entire silicon-containing layer containing Cl. In addition, a minimum value of the thickness of the silicon-containing layer containing Cl that can be formed on the wafer 200 is less than one atomic layer. Accordingly, the thickness of the silicon-containing layer containing Cl may range from less than one atomic layer to several atomic layers. When the thickness of the silicon-containing layer containing Cl is one atomic layer or less (i.e., one atomic layer or less than one atomic layer), an effect of the modification reaction in Steps 2 and 3 described later can be relatively increased, and thus a time required for the modification reaction in Steps 2 and 3 can be reduced. A time required for forming the silicon-containing layer containing Cl in Step 1 can also be reduced. As a result, a processing time per one cycle can be reduced, and a total processing time can also be reduced. That is, the film forming rate can be increased. In addition, as the thickness of the silicon-containing layer containing Cl is one atomic layer or less, it may become easier to maintain and control the film thickness uniformity.

(Residual Gas Removal)

After the silicon-containing layer containing Cl is formed, the valve 243a of the first gas supply pipe 232a is closed to stop the supply of the HCDS gas. At this time, while the APC valve 244 of the exhaust pipe 231 is in an open state, the interior of the process chamber 201 is vacuum exhausted by the vacuum pump 246 to remove the HCDS gas remaining in the process chamber 201 which does not react or remains after contributing to the formation of the silicon-containing layer containing Cl, from the process chamber 201 (residual gas removal). At this time, the valves 243e, 243f, 243g and 243h are in an open state, and the supply of the $N_2$ gas (inert gas) into the process chamber 201 is maintained. The $N_2$ gas acts as a purge gas. Thus, the HCDS gas remaining in the process chamber 201 which does not react or remains after contributing to the formation of the silicon-containing layer containing Cl can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 2 performed thereafter. Here, an amount of the $N_2$ gas supplied into the process chamber 201 need not be a large amount, and for example, approximately the same amount of the $N_2$ gas as the reaction tube 203 (the process chamber 201) may be supplied to perform the purge such that there is no adverse effect generated in Step 2. As described above, as the interior of the process chamber 201 is not completely purged, the purge time can be reduced, thereby improving the throughput. In addition, the consumption of the $N_2$ gas can also be suppressed to a minimal necessity.

The chlorosilane-based precursor gas may include an inorganic precursor gas such as a tetrachlorosilane, i.e., silicon tetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas, or the like, in addition to the hexachlorodisilane ($Si_2Cl_6$, abbreviated to HCDS) gas. The inert gas may include a rare gas such as Ar gas, He gas, Ne gas, Xe gas, and the like, in addition to the $N_2$ gas.

[Step 2]
(3DMAS Gas Supply)

After Step 1 is terminated and the residual gas in the process chamber 201 is removed, the valve 243b of the second gas supply pipe 232b is opened to flow the 3DMAS gas into the second gas supply pipe 232b. A flow rate of the 3DMAS gas flowing in the second gas supply pipe 232b is adjusted by the mass flow controller 241b. The flow rate-adjusted 3DMAS gas is supplied into the process chamber 201 through the gas supply holes 250b of the second nozzle 249b, and exhausted through the exhaust pipe 231. In this way, the 3DMAS gas is supplied to the wafer 200 (3DMAS gas supply). At the same time, the valve 243f is opened to flow the $N_2$ gas as the inert gas into the second inert gas supply pipe 232f. A flow rate of the $N_2$ gas flowing in the second inert gas supply pipe 232f is adjusted by the mass flow controller 241f. The flow rate-adjusted $N_2$ gas is supplied into the process chamber 201 together with the 3DMAS gas, and exhausted through the exhaust pipe 231. Here, in order to prevent infiltration of the 3DMAS gas into the first nozzle 249a, the third nozzle 249c, the fourth nozzle 249d, and the buffer chamber 237, the valves 243e, 243g and 243h are opened to flow the $N_2$ gas into the first inert gas supply pipe 232e, the third inert gas supply pipe 232g, and the fourth inert gas supply pipe 232h. The $N_2$ gas is supplied into the process chamber 201 through the first gas supply pipe 232a, the third gas supply pipe 232c, the fourth gas supply pipe 232d, the first nozzle 249a, the third nozzle 249c, the fourth nozzle 249d, and the buffer chamber 237, and exhausted through the exhaust pipe 231.

In this case, the APC valve 244 is appropriately adjusted to set the internal pressure of the process chamber 201 to fall within a range of, for example, 1 to 13300 Pa, or more specifically, for example, a range of 20 to 1330 Pa. A supply flow rate of the 3DMAS gas controlled by the mass flow controller 241b is set to fall within a range of, for example, 1 to 1000 sccm. A supply flow rate of the $N_2$ gas controlled by each of the mass flow controllers 241f, 241e, 241g and 241h is set to fall within a range of, for example, 100 to 10000 sccm. A time of supplying the 3DMAS gas to the wafer 200, i.e., a gas supply time (irradiation time), is set to fall within a range of, for example, 1 to 120 seconds, or more specifically, for example, a range of 1 to 60 seconds. In this case, similar to Step 1, a temperature of the heater 207 is set such that a temperature of the wafer 200 falls within a range of, for example, 250 to 700 degrees C., specifically, for example, 300 to 650 degrees C., or more specifically, for example, 350 to 600 degrees C.

As the 3DMAS gas is supplied to the wafer 200 under the above-described conditions, the silicon-containing layer containing Cl formed on the wafer 200 in Step 1 is reacted with the 3DMAS gas. Accordingly, the silicon-containing layer containing Cl is changed (modified) into a silicon carbonitride layer containing Cl (SiCN layer containing Cl) as the first layer containing silicon (Si), chlorine (Cl), carbon (C) and nitrogen (N). The first layer becomes, for example, a layer containing Si, Cl, C and N and having a thickness of less than one atomic layer to several atomic layers. In addition, the first layer becomes a layer in which a ratio of a Si element or a ratio of a C element is relatively high, i.e., a Si-rich or C-rich layer (Residual Gas Removal)

Thereafter, the valve 243b of the second gas supply pipe 232b is closed to stop the supply of the 3DMAS gas. At this time, while the APC valve 244 of the exhaust pipe 231 is in an open state, the interior of the process chamber 201 is vacuum exhausted by the vacuum pump 246, and the 3DMAS gas remaining in the process chamber 201 which does not react or remains after contributing to the reaction or reaction byproducts are removed from the process chamber 201 (residual gas removal). At this time, the valves 243f, 243e, 243g and 243f are in an open state, and the supply of the $N_2$ gas (inert gas) into the process chamber 201 is maintained. The $N_2$ gas acts as a purge gas, and thus, the 3DMAS gas remaining in the process chamber 201 which does not react or remains after contributing to the formation of the first layer or reaction byproducts can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 3 performed thereafter. Here, an amount of the $N_2$ gas supplied into the process chamber 201 need not be a large amount, and for example, approximately the same amount of the $N_2$ gas as the reaction tube 203 (the process chamber 201) may be supplied to perform the purge such that there is no adverse effect generated in Step 3. As described above, as the interior of the process chamber 201 is not completely purged, the purge time can be reduced, thereby improving the throughput. In addition, the consumption of the $N_2$ gas can also be suppressed to a minimal necessity.

The aminosilane-based precursor gas may include an organic precursor such as tetrakis(dimethylamino)silane (Si[N(CH$_3$)$_2$]$_4$, abbreviated to 4DMAS) gas, bis(diethylamino)silane (Si[N (C$_2$H$_5$)$_2$]$_2$H$_2$, abbreviated to 2DEAS) gas, bis(tert-butylamino)silane (SiH$_2$[NH(C$_4$H$_9$)]$_2$, abbreviated to BTBAS) gas, and the like, in addition to the 3DMAS gas. The inert gas may include a rare gas such as Ar gas, He gas, Ne gas, Xe gas, and the like, in addition to the $N_2$ gas.

[Step 3]
(TMB Gas Supply)

After Step 2 is terminated and the residual gas in the process chamber 201 is removed, the valve 243c of the third gas supply pipe 232c is opened to flow the TMB gas into the third gas supply pipe 232c. A flow rate of the TMB gas flowing in the third gas supply pipe 232c is adjusted by the mass flow controller 241c. The flow rate-adjusted TMB gas is supplied into the process chamber 201 through the gas supply holes 250c of the third nozzle 249c, and exhausted through the exhaust pipe 231. In this way, the TMB gas is supplied to the wafer 200 (TMB gas supply). At the same time, the valve 243g is opened to flow the N₂ gas (inert gas) into the third inert gas supply pipe 232g. A flow rate of the N₂ gas flowing in the third inert gas supply pipe 232g is adjusted by the mass flow controller 241g. The flow rate-adjusted N₂ gas is supplied into the process chamber 201 together with the TMB gas, and exhausted through the exhaust pipe 231. Here, in order to prevent infiltration of the TMB gas into the first nozzle 249a, the second nozzle 249b, the fourth nozzle 249d, and the buffer chamber 237, the valves 243e, 243f and 243h are opened to flow the N₂ gas into the first inert gas supply pipe 232e, the second inert gas supply pipe 232f, and the fourth inert gas supply pipe 232h. The N₂ gas is supplied into the process chamber 201 through the first gas supply pipe 232a, the second gas supply pipe 232b, the fourth gas supply pipe 232d, the first nozzle 249a, the second nozzle 249b, the fourth nozzle 249d, and the buffer chamber 237, and exhausted through the exhaust pipe 231.

In this case, the APC valve 244 is appropriately adjusted to set the internal pressure of the process chamber 201 to fall within a range of, for example, 1 to 13300 Pa, or more specifically, for example, 500 to 5000 Pa. A supply flow rate of the TMB gas controlled by the mass flow controller 241c is set to fall within a range of, for example, 1 to 1000 sccm. A supply flow rate of the N₂ gas controlled by each of the mass flow controllers 241g, 241e, 241f and 241h is set to fall within a range of, for example, 100 to 10000 sccm. A time of supplying the TMB gas to the wafer 200, i.e., a gas supply time (irradiation time), is set to fall within a range of, for example, 1 to 200 seconds, or more specifically, for example, 1 to 60 seconds. In this case, similar to Steps 1 and 2, a temperature of the heater 207 is set such that a temperature of the wafer 200 falls within a range of, for example, 250 to 700 degrees C., specifically, for example, 300 to 650 degrees C., or more specifically, for example, 350 to 600 degrees C.

As the TMB gas is supplied to the wafer 200 under the above-described conditions, the SiCN layer containing Cl as the first layer formed on the wafer 200 in Step 2 is reacted with the TMB gas. That is, Cl (a chloro group) contained in the first layer can be allowed to react with a ligand (a methyl group) contained in the TMB. Accordingly, Cl of the first layer reacting with the ligand of the TMB can be separated (extracted) from the first layer, and at the same time, the ligand of the TMB reacting with Cl of the first layer can be separated from the TMB. Then, the TMB from which the ligand is separated can be bonded to Si of the first layer. Specifically, a portion of a borazine ring of the TMB from which a ligand is separated can be bonded to Si of the first layer. More specifically, nitrogen constituting the borazine ring of the TMB from which the ligand is separated can be bonded to Si of the first layer. That is, among B and N constituting the borazine ring of the TMB, N having a dangling bond due to removal of an ethyl group can be bonded to Si contained in the first layer and having a dangling bond, so that it is possible to form Si—N bonding. Here, the borazine ring skeleton constituting the borazine ring of the TMB is maintained without being broken.

As the TMB gas is supplied under the above-described conditions and the first layer containing Cl can be allowed to appropriately react with the TMB while the borazine ring skeleton in the TMB is maintained without being broken, it is possible to cause a series of the above-described reactions. In addition, the most important factors (conditions) for causing the series of above-described reactions in a state where the borazine ring skeleton of the TMB is maintained are the temperature of the wafer 200 and the internal pressure of the process chamber 201, particularly the temperature of the wafer 200. Thus, it is possible to cause suitable reactions by appropriately controlling the temperature of the wafer 200 and the internal pressure of the process chamber 201.

Due to the series of reactions, the borazine ring is newly introduced into the first layer, and the first layer is changed (modified) into the second layer containing silicon (Si), carbon (C), nitrogen (N) and the borazine ring skeleton, i.e., the silicon borocarbonitride layer (SiBCN layer) containing the borazine ring skeleton. The second layer becomes a SiBCN layer containing the borazine ring skeleton, for example, having a thickness of less than one atomic layer to several atomic layers. The SiBCN layer containing the borazine ring skeleton may be referred to as a layer containing silicon (Si), boron (B), carbon (C) and nitrogen (N) and having the borazine ring skeleton.

As the borazine ring is newly introduced into the first layer, a boron (B) component constituting the borazine ring is newly introduced into the first layer. At the same time, a nitrogen (N) component constituting the borazine ring is also introduced into the first layer. In some case, a carbon (C) component contained in the ligand of the TMB is introduced into the first layer. That is, when the borazine ring is introduced into the first layer by allowing the first layer containing Cl to react with the TMB, the B component is newly added to the first layer, and the ratio of the N component in the first layer is increased. At this time, the ratio of the C component in the first layer may also be increased. That is, as the borazine ring is introduced into the first layer by allowing the first layer containing Cl to react with the TMB, it is possible to increase the ratio of the N or C component in the second layer more than the ratio of the N or C component in the first layer.

In addition, when the borazine ring is newly introduced into the first layer, C and N originally contained in the first layer may be maintained or partially desorbed. In other words, the ratio of the C or N component originally contained in the first layer when the first layer containing Cl is reacted with the TMB may be maintained or reduced. That is, as the borazine ring is introduced into the first layer by allowing the first layer containing Cl to react with the TMB, the ratio of the C or N component in the second layer can be increased or decreased more than the ratio of the C or N component in the first layer. The adjustment of the ratio of each component can be performed by adjusting the processing conditions such as the internal pressure of the process chamber 201.

In addition, when the first layer containing Cl is reacted with the TMB, impurities such as Cl in the first layer are extracted or desorbed from the first layer by the above-described reactions, thereby being separated from the first layer. Accordingly, the second layer becomes to have fewer impurities such as Cl than the first layer.

Further, when the first layer is modified to form the second layer containing Si, C, N and the borazine ring skeleton (the SiBCN layer containing the borazine ring skeleton) by allowing the first layer containing Cl to react with the alkylborazine compound such as the TMB, the borazine ring skeleton constituting the borazine ring contained in the borazine compound (TMB) is maintained without being broken, whereby the central space of the borazine ring can be maintained and thus the SiBCN layer that is porous can be formed.

(Residual Gas Removal)

Thereafter, the valve 243c of the third gas supply pipe 232c is closed to stop the supply of the TMB gas. At this time, while the APC valve 244 of the exhaust pipe 231 is in an open state, the interior of the process chamber 201 is vacuum exhausted by the vacuum pump 246, and the TMB gas remaining in the process chamber 201 which does not react or remains after contributing to the reaction or reaction byproducts are removed from the process chamber 201 (residual gas removal). At this time, the valves 243g, 243e, 243f and 243h are in an open state, and the supply of the N$_2$ gas as the inert gas into the process chamber 201 is maintained. The N$_2$ gas acts as a purge gas, and thus, the TMB gas remaining in the process chamber 201 which does not react or remains after contributing to the formation of the second layer or reaction byproducts can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 1 performed thereafter. Here, an amount of the N$_2$ gas supplied into the process chamber 201 need not be a large amount, and for example, approximately the same amount of the N$_2$ gas as the reaction tube 203 (the process chamber 201) may be supplied to perform the purge such that there is no adverse effect generated in Step 1. As described above, as the interior of the process chamber 201 is not completely purged, the purge time can be reduced, thereby improving the throughput. In addition, the consumption of the N$_2$ gas can also be suppressed to a minimal necessity.

Figure 12D:
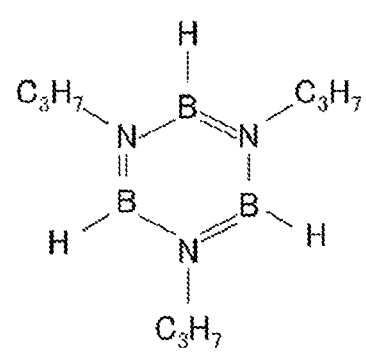

The reaction gas containing the borazine compound may include, for example, n,n',n''-triethylborazine (abbreviated to TEB) gas, n,n',n''-tri-n-propylborazine (abbreviated to TPB) gas, a n,n',n''-triisopropylborazine (abbreviated to TIPB) gas, n,n',n''-tri-n-butylborazine (abbreviated to TBB) gas, a n,n', n''-triisobutylborazine (abbreviated to TIBB) gas, and the like, in addition to the TMB gas. For example, the TPB may be represented by the chemical structural formula shown in FIG. 12B, wherein R$_1$, R$_3$ and R$_5$ are H and R$_2$, R$_4$ and R$_6$ are a propyl group (—C$_3$H$_7$), or chemical structural formula shown in FIG. 12D. In addition, the TMB is a borazine compound having a borazine ring skeleton and containing a methyl group as a ligand, the TEB is a borazine compound having a borazine ring skeleton and containing an ethyl group as a ligand, the TPB is a borazine compound having a borazine ring skeleton and containing a propyl group as a ligand, the TIPB is a borazine compound having a borazine ring skeleton and containing an isopropyl group as a ligand, the TBB is a borazine compound having a borazine ring skeleton and containing a butyl group as a ligand, and the TIBB is a borazine compound having a borazine ring skeleton and containing an isobutyl group as a ligand. The inert gas may include a rare gas such as Ar gas, He gas, Ne gas, Xe gas, and the like, in addition to the N$_2$ gas.

(Performing Predetermined Number of Times)

The above-mentioned Steps 1 to 3 may be set as one cycle and the cycle may be performed once or more (i.e., a predetermined number of times) to form the silicon borocarbonitride film (SiBCN film) containing the borazine ring skeleton and having the predetermined composition and a predetermined film thickness on the wafer 200. Also, the above-described cycle may be performed multiple times. That is, it is possible that a thickness of the SiBCN layer containing the borazine ring skeleton formed per cycle is set to be smaller than a desired film thickness, and the above-described cycle is repeated multiple times until the desired film thickness is obtained.

In this case, a ratio of respective element components of the SiBCN layer containing the borazine ring skeleton, i.e., a ratio of a silicon component, a boron component, a carbon component, and a nitrogen component, i.e., a silicon concentration, a boron concentration, a carbon concentration, and a nitrogen concentration, may be adjusted by controlling the processing conditions such as the internal pressure of the process chamber 201 or the gas supply time in each step, thereby controlling a composition ratio of the SiBCN film containing the borazine ring skeleton.

Also, when the cycle is performed multiple times, the phrase "a predetermined gas is supplied to the wafer 200" in each step after at least two cycles means that a predetermined gas is supplied to a layer formed on the wafer 200, i.e., the uppermost surface of the wafer 200, which is a laminated body. The phrase "a predetermined layer is formed on the wafer 200" means that a predetermined layer is formed on a layer formed on the wafer 200, i.e., the uppermost surface of the wafer 200, which is a laminated body. Also, above-described matters are similar in other film forming sequences, other embodiments, or other modifications described later.

(Purge and Return to Atmospheric Pressure)

When the SiBCN film containing the borazine ring skeleton having the predetermined composition and the predetermined film thickness has been formed, the valves 243e, 243f, 243g and 243h are opened to supply the N$_2$ gas as the inert gas from the first inert gas supply pipe 232e, the second inert gas supply pipe 232f, the third inert gas supply pipe 232g, and the fourth inert gas supply pipe 232h into the process chamber 201, respectively, and exhausted through the exhaust pipe 231. The N$_2$ gas acts as a purge gas and the interior of the process chamber 201 is purged with the inert gas, so that the gas remaining in the process chamber 201 or reaction byproducts are removed from the process chamber 201 (purge). Thereafter, an atmosphere in the process chamber 201 is substituted with the inert gas (inert gas substitution), and the internal pressure of the process chamber 201 returns to normal pressure (return to atmospheric pressure).

(Boat Unload and Wafer Discharge)

Thereafter, the seal cap 219 is lowered by the boat elevator 115 to open the lower end of the reaction tube 203, and the processed wafer 200 supported by the boat 217 is unloaded to the outside of the reaction tube 203 through the lower end of the reaction tube 203 (boat unload). Then, the processed wafer 200 is discharged from the boat 217 (wafer discharge).

(Second Sequence)

Figure 5:
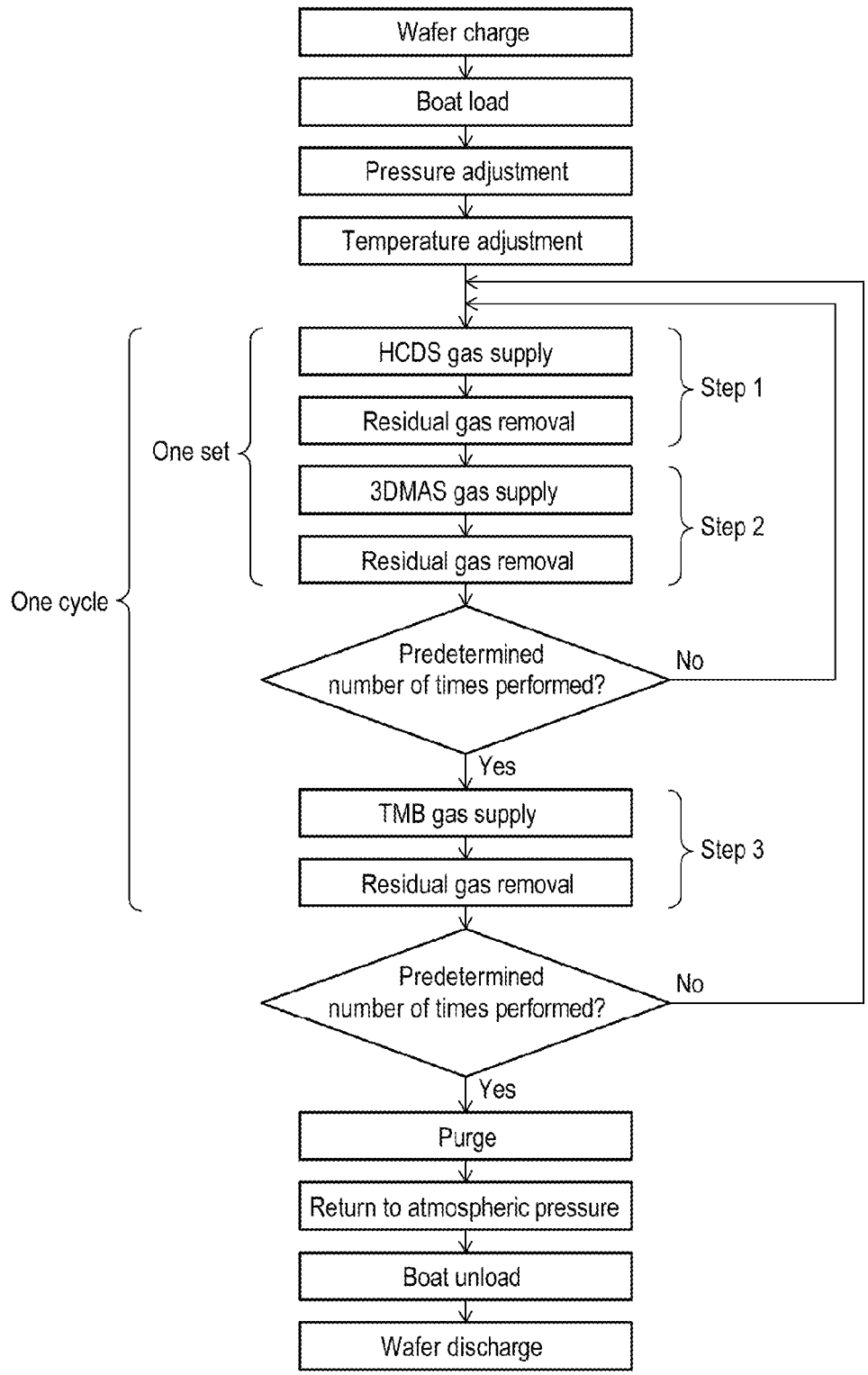
FIG. 5 is a view illustrating a flow of film formation in a second sequence according to the first embodiment.
Figure 7:
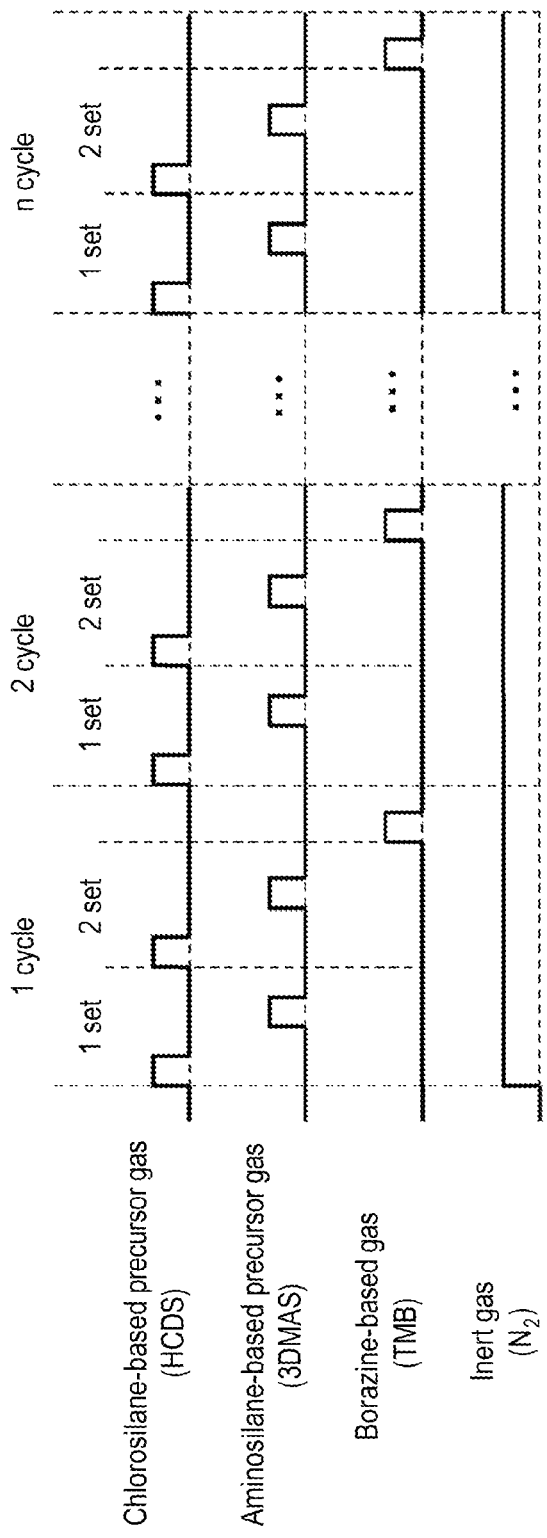
FIG. 7 is a view illustrating timings for gas supply in the second sequence according to the first embodiment.

Next, a second sequence of the embodiment will be described. FIG. 5 is a view illustrating a flow of film formation in the second sequence of the embodiment. FIG. 7 is a view illustrating timings for supplying gas in the second sequence of the embodiment.

In the second sequence of the embodiment, a silicon borocarbonitride film (SiBCN film) containing a borazine ring skeleton as a thin film containing silicon, carbon, nitrogen and the borazine ring skeleton is formed on a wafer 200 by performing a cycle for a first predetermined number of times, the cycle including:

forming a silicon carbonitride layer containing chlorine (SiCN layer containing Cl) as a first layer containing silicon, a chloro group (chlorine), carbon and nitrogen by performing supplying a chlorosilane-based precursor gas containing silicon and the chloro group to the wafer 200 in the process chamber 201 and supplying an aminosilane-based precursor gas containing silicon and an amino group to the wafer 200 in the process chamber 201, for a second predetermined number of times (a plurality of times), and forming a silicon borocarbonitride layer (SiBCN layer) containing the borazine ring skeleton as a second layer containing silicon, carbon, nitrogen and the borazine ring skeleton by supplying a reaction gas containing a borazine compound to the wafer 200 in the process chamber 201 and allowing the first layer to react with the borazine compound to modify the first layer under a condition in which the borazine ring skeleton in the borazine compound is maintained.

In addition, FIGS. 5 and 7 show an example of performing supplying the chlorosilane-based precursor gas to the wafer 200 in the process chamber 201 and then supplying the aminosilane-based precursor gas to the wafer 200 in the process chamber 201, which are alternately repeated a plurality of times, i.e., an example of supplying the chlorosilane-based precursor gas prior to the aminosilane-based precursor gas, when the first layer is formed.

That is, in the second sequence, after Steps 1 and 2 of the above-described first sequence are set as one set and the set is repeated a plurality of times, Step 3 is performed. Then, the repeated set of Steps 1 and 2 and Step 3 are set as one cycle, and the cycle is performed for a predetermined number of times, thereby forming the SiBCN film containing the borazine ring skeleton having a predetermined composition and a predetermined film thickness on the wafer 200. FIG. 7 shows an example in which the above-described Steps 1 and 2 are set as one set and the set is performed twice before Step 3 is performed, and the repeated set of Steps 1 and 2 and Step 3 are set as one cycle and the cycle is performed n times, thereby forming the SiBCN film containing the borazine ring skeleton having a predetermined composition and a predetermined film thickness on the wafer 200. The second sequence is different from the first sequence in that the above-described Steps 1 and 2 are set as one set and the set is repeated a plurality of times before Step 3 is performed, and the others may be performed in the same way as the first sequence. The processing conditions of the second sequence may also be the same as the processing conditions of the above-described first sequence.

(3) Effects According to the Embodiment

According to the embodiment, one or more effects are shown as described later.

According to the first and second sequences of the embodiment, as the cycle including Steps 1 to 3 is performed for a predetermined number of times, the SiBCN film having a high resistance to hydrogen fluoride (HF) and a low dielectric constant, as compared with a conventional SiCN or SiOCN film, can be formed on the wafer 200 in a low temperature range. That is, a thin film having the improved resistance to HF and the reduced dielectric constant, which are in a trade-off relationship, can be formed in a low temperature range.

In addition, according to the first and second sequences of the embodiment, since impurities such as Cl can be extracted or desorbed from the first layer in Step 3 by allowing the first layer containing Cl to react with the TMB gas, the second layer can become a layer having fewer impurities. Accordingly, since it is possible to reduce a concentration of impurities in the SiBCN film formed by performing the cycle including Steps 1 to 3 for a predetermined number of times, it is possible to more improve the resistance to HF of the SiBCN film.

According to the first and second sequences of the embodiment, when the first layer containing Cl (SiCN layer containing Cl) is modified to form the second layer (SiBCN layer) by supplying the alkylborazine compound such as TMB to the first layer containing Cl in Step 3, the borazine ring skeleton constituting the borazine ring contained in the borazine compound is maintained without being broken, and thus the central space of the borazine ring can be maintained and the second layer can be made porous. Since the SiBCN film formed by performing the cycle including Steps 1 to 3 for a predetermined number of times can be made porous, it is possible to further reduce the dielectric constant of the SiBCN film. That is, it is possible to form a low dielectric constant film (low-k film) having a porous structure and having an extremely low dielectric constant.

In addition, according to the first and second sequences of the embodiment, as the two precursors (silane sources), i.e., the chlorosilane-based precursor and the aminosilane-based precursor, are used, it is possible to form a SiBCN film of a good quality having the above-described superior characteristics even in a low temperature range. According to the inventor's experiments, when the chlorosilane-based precursor was used solely, it was difficult to deposit silicon on the wafer 200 at a film forming rate satisfying the production efficiency in a temperature range of 500 degrees C. or less. In addition, when the aminosilane-based precursor was used solely, it was also not confirmed that silicon was deposited on the wafer 200 in a temperature range of 500 degrees C. or less. However, according to the method of the embodiment, even in a low temperature range of 500 degrees C. or less, for example, 250 to 500 degrees C., the SiBCN film of good quality having the above-described superior characteristics can be formed at a film forming rate satisfying production efficiency by a thermochemical reaction without using the plasma.

If the film forming temperature is low, kinetic energy of molecules is generally lowered, which makes it difficult to cause the reaction/desorption of chlorine contained in the chlorosilane-based precursor or amine contained in the aminosilane-based precursor, so that these ligands remain on the surface of the wafer 200. In addition, the remaining ligands become steric hindrance, so that the adsorption of silicon onto the surface of the wafer 200 is hindered to decrease silicon density and cause deterioration of a film. However, even under the conditions in which it is difficult for the reaction/desorption to proceed, it is possible to desorb residual ligands of the two silane sources, i.e., the chlorosilane-based precursor and the aminosilane-based precursor, by allowing them to react appropriately. In addition, the desorption of their residual ligands causes the steric hindrance to be solved, which in turn makes it possible to adsorb silicon to an open site, thereby being capable of increasing silicon density. Accordingly, it seems that a film having high silicon density can be formed by thermochemical reaction without using plasma even in a low temperature range of 500 degrees C. or less.

Also, according to the first and second sequences of the embodiment, as the first layer containing Si, Cl, C and N is formed on the wafer 200 by supplying the chlorosilane-based precursor in Step 1 and supplying the aminosilane-based precursor in Step 2 and then the first layer is modified to form the second layer by supplying the borazine-based gas in Step 3, it is possible to adjust a boron concentration, a nitrogen concentration, and a carbon concentration in the second layer to desired values. Accordingly, the composition of the SiBCN film formed by performing the cycle including Steps 1 to 3 once or more (a predetermined number of times) can be easily controlled, thereby making it possible to form a SiBCN film having desired characteristics.

In addition, according to the second sequence of the embodiment, Steps 1 and 2 are set as one set and the set is repeated a plurality of times, and then Step 3 is performed. Then, the repeated set of Steps 1 and 2 and Step 3 are set as one cycle and the cycle is performed once or more (a predetermined number of times). As a result, ratios of a silicon component, a carbon component and a nitrogen component to a boron component of a SiBCN film can be controlled appropriately (to be rich), thereby further improving the composition controllability of the SiBCN film. Also, the number of the first layers formed per cycle can be increased as much as the number of the sets by increasing the number of the sets, thereby making it possible to improve a cycle rate. In addition, it is also possible to improve a film forming rate accordingly.

<Second Embodiment of Present Disclosure>

Next, a second embodiment of the present disclosure will be described.

In the above-described first embodiment, an example in which a thin film containing a predetermined element, carbon, nitrogen and a borazine ring skeleton (SiBCN film) is formed on a substrate by performing a cycle including Steps 1 to 3 for a predetermined number of times has been described. On the other hand, in this embodiment, an example in which a thin film containing a predetermined element, nitrogen and a borazine ring skeleton (SiBN film), or a thin film containing a predetermined element, carbon, nitrogen and a borazine ring skeleton (SiBCN film) is formed on a substrate by performing a cycle further including Step 4 of supplying a nitriding gas ($NH_3$ gas) to a substrate in addition to the above-described Steps 1 to 3 for a predetermined number of times will be described.

In the film formation sequence of the second embodiment, a thin film containing a predetermined element, nitrogen and a borazine ring skeleton, or a thin film containing a predetermined element, carbon, nitrogen and a borazine ring skeleton is formed on a substrate by performing a cycle for a first predetermined number of times, the cycle including:

forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times, forming a second layer containing the predetermined element, carbon, nitrogen and a borazine ring skeleton by supplying a reaction gas containing a borazine compound to the substrate and allowing the first layer to react with the borazine compound to modify the first layer under a condition in which the borazine ring skeleton in the borazine compound is maintained, and forming a third layer containing the predetermined element, nitrogen and the borazine ring skeleton, or a third layer the predetermined element, carbon, nitrogen and the borazine ring skeleton by supplying a nitriding gas to the substrate and nitriding the second layer to modify the second layer under a condition in which the borazine ring skeleton in the second layer is maintained.

The act of forming the first layer and the act of forming the second layer are performed in the same manner as the above-described first embodiment.

In the act of forming the third layer, the second layer is modified by nitriding the second layer under the condition in which the borazine ring skeleton in the second layer is maintained by the nitriding gas. That is, nitrogen is further added to the second layer by nitriding the second layer. In addition, carbon contained in the second layer is at least partially separated (extracted) from the second layer by nitriding the second layer.

In the second embodiment, in the act of forming the third layer, a layer containing silicon, nitrogen and the borazine ring skeleton (silicon boronitride layer) is formed as the third layer containing the predetermined element, nitrogen and the borazine ring skeleton, or a layer containing silicon, carbon, nitrogen and the borazine ring skeleton (silicon borocarbonitride layer) is formed as the third layer containing the predetermined element, carbon, nitrogen and the borazine ring skeleton. In addition, as the above-described cycle is performed for a predetermined number of times, a thin film containing silicon, nitrogen and the borazine ring skeleton (silicon boronitride film) is formed as the thin film containing the predetermined element, nitrogen and the borazine ring skeleton, or a thin film containing silicon, carbon, nitrogen and the borazine ring skeleton (silicon borocarbonitride film) is formed as the thin film containing the predetermined element, carbon, nitrogen and the borazine ring skeleton.

(First Sequence)

Figure 8:
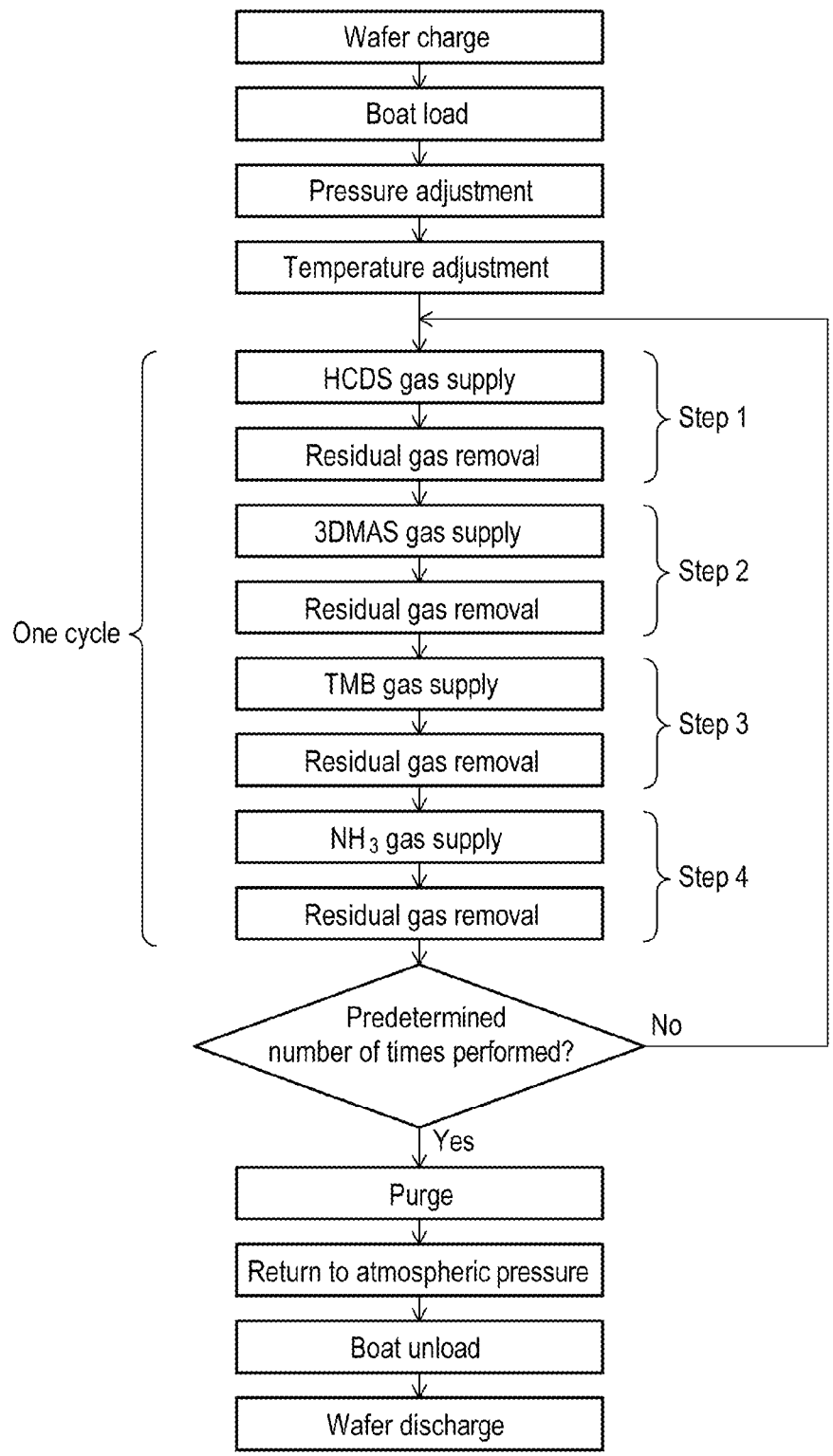
FIG. 8 is a view illustrating a flow of film formation in a first sequence according to a second embodiment.
Figure 10B:
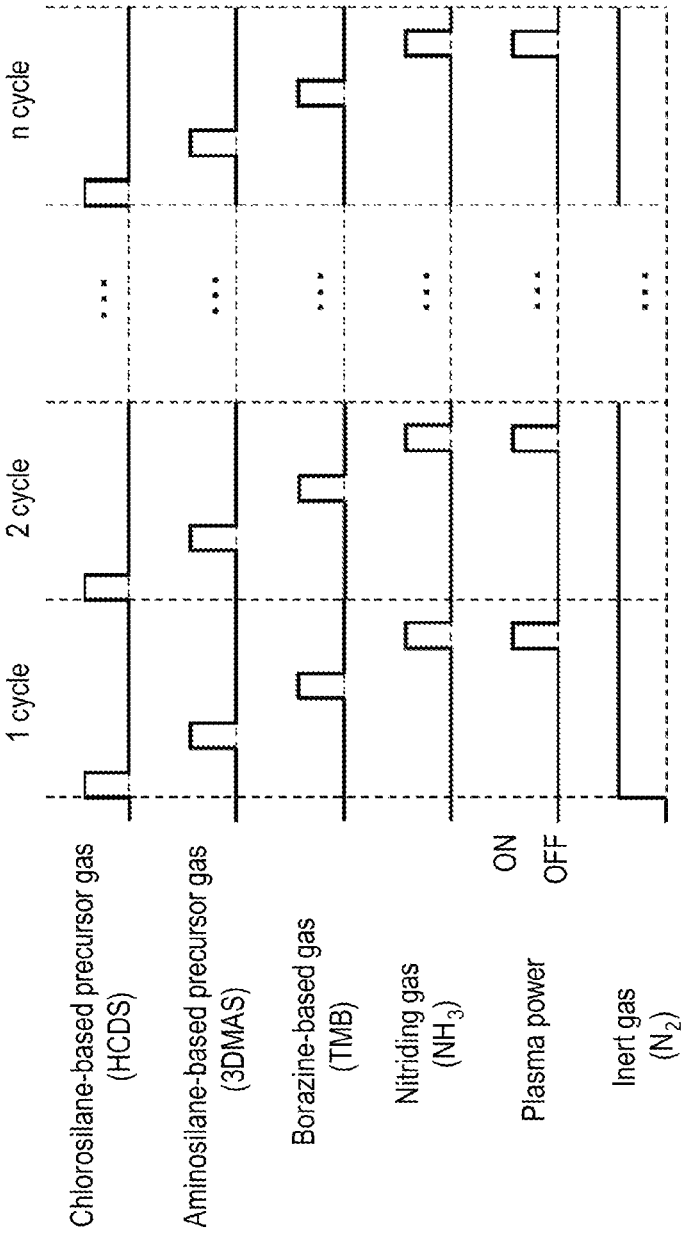

First, a first sequence of the second embodiment will be described. FIG. 8 is a view illustrating a flow of film formation in the first sequence of the second embodiment. FIGS. 10A and 10B are views illustrating timings for gas supply and plasma power supply in the first sequence according to the second embodiment, wherein FIG. 10A shows an example of a sequence in which a film is formed under non-plasma conditions, and FIG. 10B shows an example of a sequence in which a film is formed using plasma.

In the first sequence of the second embodiment, a silicon boronitride film (SiBN film) containing a borazine ring skeleton as a thin film containing silicon, nitrogen and the borazine ring skeleton, or a silicon borocarbonitride film (SiBCN film) containing a borazine ring skeleton as a thin film containing silicon, carbon, nitrogen and the borazine ring skeleton is formed on the wafer 200 by performing a cycle for a first predetermined number of times, the cycle including:

forming a silicon carbonitride layer containing chlorine (SiCN layer containing Cl) as a first layer containing silicon, a chloro group (chlorine), carbon and nitrogen by performing supplying a chlorosilane-based precursor gas containing silicon and the chloro group to the wafer 200 in the process chamber 201 and supplying an aminosilane-based precursor gas containing silicon and an amino group to the wafer 200 in the process chamber 201, for a second predetermined number of times (once), forming a silicon borocarbonitride layer (SiBCN layer) containing the borazine ring skeleton as a second layer containing silicon, carbon, nitrogen and the borazine ring skeleton by supplying a reaction gas containing a borazine compound to the wafer 200 in the process chamber 201 and allowing the first layer to react with the borazine compound to modify the first layer under a condition in which the borazine ring skeleton in the borazine compound is maintained, and forming a silicon boronitride layer (SiBN layer) containing the borazine ring skeleton as a third layer containing silicon, nitrogen and the borazine ring skeleton, or a silicon borocarbonitride layer (SiBCN layer) containing the borazine ring skeleton as a third layer containing silicon, carbon, nitrogen and the borazine ring skeleton by supplying a nitriding gas to the wafer 200 in the process chamber 201 and nitriding the second layer to modify the second layer under a condition in which the borazine ring skeleton in the second layer is maintained.

In addition, FIGS. 8 and 10 show an example of performing supplying the chlorosilane-based precursor gas to the wafer 200 in the process chamber 201 and then supplying the aminosilane-based precursor gas to the wafer 200 in the process chamber 201, i.e., an example of supplying the chlorosilane-based precursor gas prior to the aminosilane-based precursor gas, when the first layer is formed.

The first sequence of the second embodiment is different from the first sequence of the first embodiment only in that Step 4 is further included in addition to Steps 1 to 3, and the other steps are performed similarly to the first sequence of the first embodiment. Hereinafter, Step 4 of the second embodiment will be described.

[Step 4]
(NH$_3$ Gas Supply)

After Step 3 is terminated and the residual gas in the process chamber 201 is removed, the valve 243d of the fourth gas supply pipe 232d is opened to flow the NH$_3$ gas into the fourth gas supply pipe 232d. A flow rate of the NH$_3$ gas flowing in the fourth gas supply pipe 232d is adjusted by the mass flow controller 241d. The flow rate-adjusted NH$_3$ gas is supplied into the buffer chamber 237 through the gas supply holes 250d of the fourth nozzle 249d. At this time, if no high-frequency power is applied between the first rod-shaped electrode 269 and the second rod-shaped electrode 270, the NH$_3$ gas supplied into the buffer chamber 237 is activated by the heat to be supplied into the process chamber 201 through the gas supply holes 250e and exhausted through the exhaust pipe 231 (see FIG. 10A). On the other hand, at this time, if high-frequency power is applied between the first rod-shaped electrode 269 and the second rod-shaped electrode 270 from the high-frequency power source 273 through the matcher 272, the NH$_3$ gas supplied into the buffer chamber 237 is plasma-excited, supplied as an active species into the process chamber 201 through the gas supply holes 250e, and exhausted through the exhaust pipe 231 (see FIG. 10B). In this way, the NH$_3$ gas activated by heat or plasma is supplied to the wafer 200. At the same time, the valve 243h is opened to flow the N$_2$ gas into the fourth inert gas supply pipe 232h. The N$_2$ gas is supplied into the process chamber 201 together with the NH$_3$ gas, and exhausted through the exhaust pipe 231. Here, in order to prevent infiltration of the NH$_3$ gas into the first nozzle 249a, the second nozzle 249b, and the third nozzle 249c, the valves 243e, 243f and 243g are opened to flow the N$_2$ gas into the first inert gas supply pipe 232e, the second inert gas supply pipe 232f, and the third inert gas supply pipe 232g. The N$_2$ gas is supplied into the process chamber 201 through the first gas supply pipe 232a, the second gas supply pipe 232b, the third gas supply pipe 232c, the first nozzle 249a, the second nozzle 249b, and the third nozzle 249c, and exhausted through the exhaust pipe 231.

When the NH$_3$ gas is not plasma-excited but is activated by heat and is allowed to flow, the APC valve 244 is appropriately adjusted to set the internal pressure of the process chamber 201 to fall within a range of, for example, 1 to 3000 Pa. The internal pressure of the process chamber 201 is set to fall within a relatively high pressure range, thereby making it possible to thermally activate the NH$_3$ gas under non-plasma conditions. In addition, if the NH$_3$ gas is activated by heat and supplied, relatively soft reaction can be caused, thereby making it possible to perform the nitriding described later more softly. A partial pressure of the NH$_3$ gas in the process chamber 201 is set to fall within a range of, for example, 0.01 to 2970 Pa. A supply flow rate of the NH$_3$ gas controlled by the mass flow controller 241d is set to fall within a range of, for example, 100 to 10000 sccm. A supply flow rate of the N$_2$ gas controlled by each of the mass flow controllers 241h, 241e, 241f and 241g is set to fall within a range of, for example, 100 to 10000 sccm. A time of supplying the NH$_3$ gas activated by heat to the wafer 200, i.e., a gas supply time (irradiation time), is set to fall within a range of, for example, 1 to 120 seconds, or more specifically, for example, 1 to 60 seconds. In this case, a temperature of the heater 207 is set such that a temperature of the wafer 200 falls within a range of, for example, 250 to 700 degrees C., specifically, for example, 300 to 650 degrees C., or more specifically, for example, 350 to 600 degrees C., in the same way as Steps 1 to 3.

When the NH$_3$ gas is plasma-excited and allowed to flow as an active species, the APC valve 244 is appropriately adjusted to set the internal pressure of the process chamber 201 to fall within a range of, for example, 1 to 100 Pa. Even though the internal pressure of the process chamber 201 is set to fall within such a relatively low pressure range by using plasma, it is possible to activate the NH$_3$ gas. A partial pressure of the NH$_3$ gas in the process chamber 201 is set to fall within a range of, for example, 0.01 to 100 Pa. A supply flow rate of the NH$_3$ gas controlled by the mass flow controller 241d is set to fall within a range of, for example, 100 to 10000 sccm. A supply flow rate of the N$_2$ gas controlled by each of the mass flow controllers 241h, 241e, 241f and 241g is set to fall within a range of, for example, 100 to 10000 sccm. A time of supplying the active species obtained by plasma-exciting the NH$_3$ gas to the wafer 200, i.e., a gas supply time (irradiation time), is set to fall within a range of, for example, 1 to 120 seconds, or more specifically, for example, 1 to 60 seconds. Here, a temperature of the heater 207 is set such that a temperature of the wafer 200 falls within a range of, for example, 250 to 700 degrees C., specifically, for example, 300 to 650 degrees C., or more specifically, for example, 350 to 600 degrees C., in the same way as Steps 1 to 3. The high-frequency power applied between the first rod-shaped electrode 269 and the second rod-shaped electrode 270 from the high-frequency power source 273 is set to fall within a range of, for example, 50 to 1000 W.

Here, the gas flowing in the process chamber 201 is the NH$_3$ gas thermally activated by increasing the internal pressure of the process chamber 201 or the active species obtained by plasma-exciting the NH$_3$ gas, and none of HCDS gas, 3DMAS gas, and TMB gas are allowed to flow in the process chamber 201. Accordingly, the NH$_3$ gas activated without a gas phase reaction, or the NH$_3$ gas converted into active species is reacted with at least a portion of the second layer containing Si, C, N and the borazine ring skeleton formed on the wafer 200 in Step 3. Accordingly, the second layer is nitrided to be modified into the third layer containing Si, N and the borazine ring skeleton (SiBN layer), or the third layer containing Si, C, N and the borazine ring skeleton (SiBCN layer).

In the act of forming the third layer, the second layer is modified by nitriding the second layer, under the conditions in which the borazine ring skeleton in the second layer is maintained by the nitriding gas. That is, nitrogen is further added to the second layer by nitriding the second layer. In addition, carbon contained in the second layer is at least partially separated (extracted) from the second layer by nitriding the second layer. Here, the borazine ring skeleton constituting the borazine ring included in the second layer is maintained without being broken.

As the NH$_3$ gas is supplied under the above-described conditions and the second layer can be allowed to appropriately react with the NH$_3$ gas while the borazine ring skeleton in the second layer can be maintained without being broken, it is possible to cause the above-described reaction. In addition, it seems that the most important factors (conditions) for causing the above-described reaction in a state where the borazine ring skeleton of the second layer is maintained are the temperature of the wafer 200 and the internal pressure of the process chamber 201, particularly the temperature of the wafer 200. Thus, it is possible to cause suitable reactions by appropriately controlling the temperature of the wafer 200 and the internal pressure of the process chamber 201.

In addition, as shown in FIG. 10A, as the NH$_3$ gas activated by heat is allowed to flow into the process chamber 201 to thermally nitride the second layer, the second layer can be modified (changed) into the SiBN or SiBCN layer. At this time, as a C component is desorbed (extracted) from the second layer by means of the energy of the activated NH$_3$ gas while increasing a ratio of a N component in the second layer, the second layer is modified into the SiBN or SiBCN layer. Here, an effect of the thermal nitriding by the $NH_3$ gas also causes the Si—N bonding to increase but the Si—C bonding and the Si—Si bonding to decrease in the second layer, and a ratio of a C component and a ratio of a Si component in the second layer are decreased. In particular, most of the C component may be desorbed to be reduced to an impurity level. That is, while changing a composition ratio such that a nitrogen concentration is increased but a carbon concentration and a silicon concentration are decreased, the second layer can be modified into the SiBN or SiBCN layer. Furthermore, by controlling processing conditions, such as the internal pressure of the process chamber 201 and the gas supply time, a ratio of a N component in the SiBN or SiBCN layer, i.e., a nitrogen concentration can be finely adjusted, so that a composition ratio of the SiBN or SiBCN layer can be more precisely controlled.

Also, as shown in FIG. 10B, as the active species obtained by plasma-exciting the $NH_3$ gas is allowed to flow into the process chamber 201 to plasma-nitride the second layer, the second layer can be modified (changed) into the SiBN or SiBCN layer. At this time, as the C component is desorbed (extracted) from the second layer by means of the energy of the active species while increasing a ratio of the N component in the second layer, the second layer is modified into the SiBN or SiBCN layer. Here, an effect of the plasma-nitriding by the $NH_3$ gas also causes the Si—N bonding to increase but the Si—C bonding and the Si—Si bonding to decrease in the second layer, and a ratio of the C component and a ratio of a Si component in the second layer are decreased. In particular, most of the C component may be desorbed to be reduced to an impurity level or substantially disappear. That is, while changing a composition ratio such that a nitrogen concentration is increased but a carbon concentration and a silicon concentration are decreased, the second layer can be modified into the SiBN or SiBCN layer. Furthermore, by controlling processing conditions, such as the internal pressure of the process chamber 201 and the gas supply time, a ratio of the N component in the SiBN or SiBCN layer, i.e., a nitrogen concentration can be finely adjusted, so that a composition ratio of the SiBN or SiBCN layer can be more precisely controlled.

At this time, the nitriding reaction of the second layer may not be saturated. For example, in Steps 1 to 3, when the second layer having a thickness of less than one atomic layer to several atomic layers is formed, the second layer may be partially nitrided. In this case, in order not to nitride the entire of the second layer having a thickness of less than one atomic layer to several atomic layers, the second layer is nitrided under a condition in which the nitriding reaction of the second layer is unsaturated.

In order to unsaturate the nitriding reaction of the second layer, the processing conditions in Step 4 need only be the above-described processing conditions, but, furthermore, it is easy to unsaturate the nitriding reaction of the second layer by making the processing conditions in Step 4 the next processing conditions.

[When Flowing $NH_3$ Gas Activated by Heat]
Wafer Temperature: 500 to 650 degrees C.
Internal Pressure of Process Chamber: 133 to 2666 Pa
Partial Pressure of $NH_3$ Gas: 33 to 2515 Pa
Supply Flow Rate of $NH_3$ Gas: 1000 to 5000 sccm
Supply Flow Rate of $N_2$ Gas: 300 to 3000 sccm
Supply Time of $NH_3$ Gas: 6 to 60 seconds
[When Flowing $NH_3$ Gas Plasma-Activated]
Wafer Temperature: 500 to 650 degrees C.
Internal Pressure of Process Chamber: 33 to 80 Pa
Partial Pressure of $NH_3$ Gas: 17 to 75 Pa
Supply Flow Rate of $NH_3$ Gas: 1000 to 5000 sccm
Supply Flow Rate of $N_2$ Gas: 300 to 1000 sccm
Supply Time of $NH_3$ Gas: 6 to 60 seconds
(Residual Gas Removal)

Thereafter, the valve 243d of the fourth gas supply pipe 232d is closed to stop the supply of the $NH_3$ gas. At this time, while the APC valve 244 of the exhaust pipe 231 is in an open state, the interior of the process chamber 201 is vacuum exhausted by the vacuum pump 246, and the $NH_3$ gas remaining in the process chamber 201 which does not react or remains after contributing to the formation of the third layer or reaction byproducts are removed from the process chamber 201 (residual gas removal). At this time, the valves 243h, 243e, 243f and 243g are in an open state, the supply of the $N_2$ gas into the process chamber 201 is maintained. The $N_2$ gas acts as a purge gas, and thus, the $NH_3$ gas remaining in the process chamber 201 which does not react or remains after contributing to the formation of the third layer or reaction byproducts can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 1 performed thereafter. Here, an amount of the $N_2$ gas supplied into the process chamber 201 need not be a large amount, and for example, approximately the same amount of the $N_2$ gas as the reaction tube 203 (the process chamber 201) may be supplied to perform the purge such that there is no adverse effect generated in Step 1. As described above, as the interior of the process chamber 201 is not completely purged, the purge time can be reduced, thereby improving the throughput. In addition, the consumption of the $N_2$ gas can also be suppressed to a minimal necessity.

The nitrogen-containing gas may include diazen ($N_2H_2$) gas, hydrazine ($N_2H_4$) gas, $N_3H_8$ gas, gas containing these compounds, and the like, in addition to the $NH_3$ gas. The inert gas may include a rare gas such as Ar gas, He gas, Ne gas, Xe gas, and the like, in addition to the $N_2$ gas (Performing Predetermined Number of Times)

The above-mentioned Steps 1 to 4 may be set as one cycle and the cycle may be performed once or more (i.e., a predetermined number of times) to form a silicon boronitride film (SiBN film) or silicon borocarbonitride film (SiBCN film) containing a borazine ring skeleton and having a predetermined composition and a predetermined film thickness on the wafer 200. Also, the above-described cycle may be performed multiple times. That is, a thickness of the SiBN or SiBCN layer containing the borazine ring skeleton formed per cycle may be set to be smaller than a desired film thickness, and the above-described cycle may be repeated multiple times until the desired film thickness is obtained.

(Second Sequence)

Figure 11A:
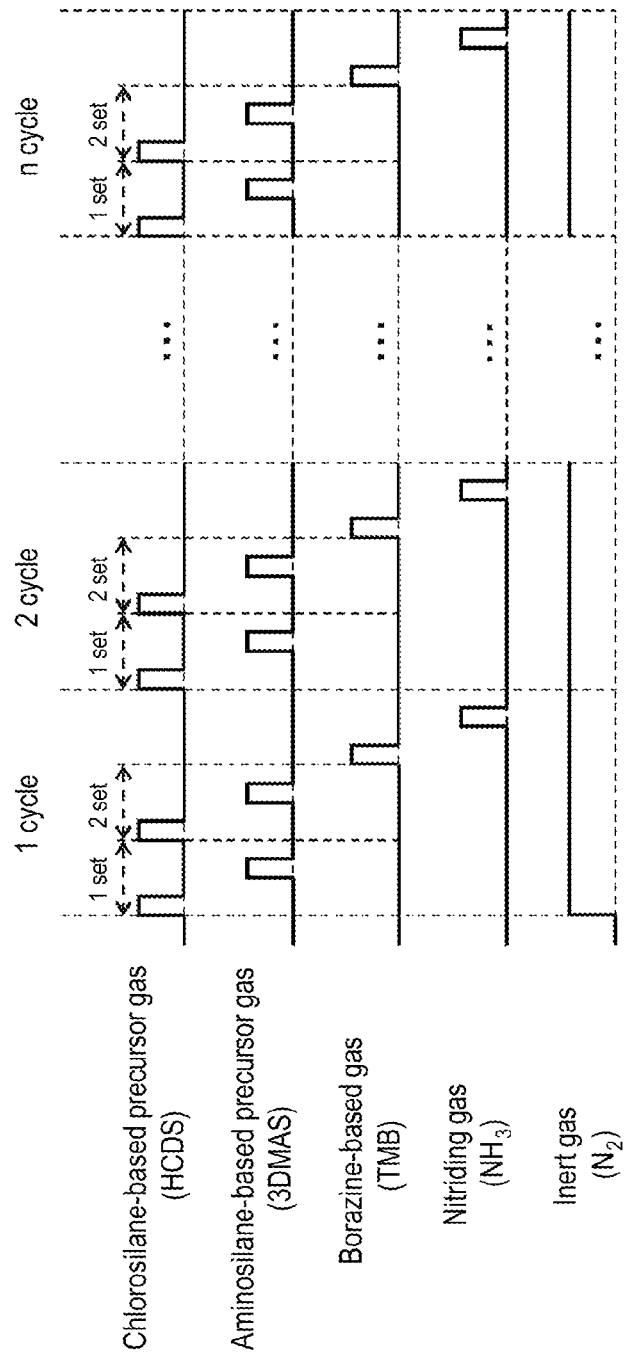
Figure 11B:
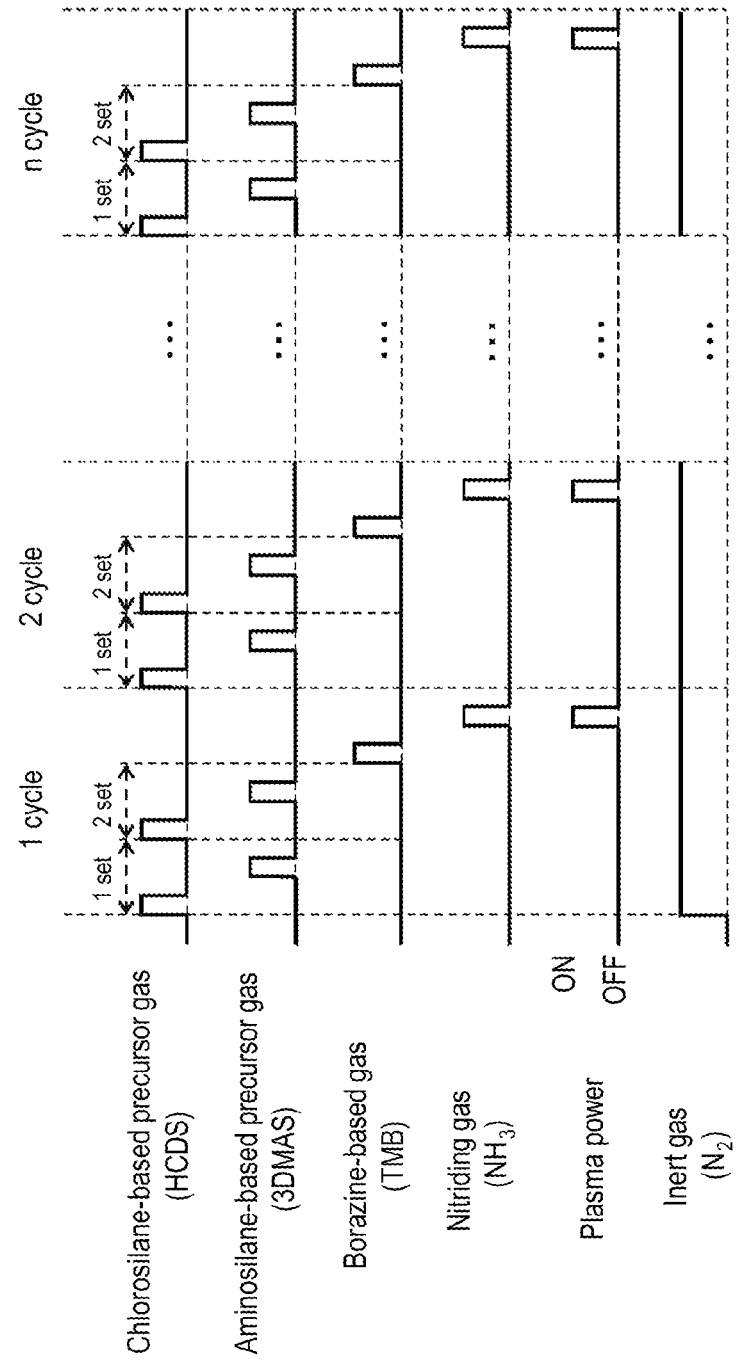

Next, a second sequence of the second embodiment will be described. FIG. 9 is a view illustrating a flow of film formation in a second sequence according to the second embodiment. FIGS. 11A and 11B are views illustrating timings for gas supply and plasma power supply in the second sequence according to the second embodiment, wherein FIG. 11A shows an example of a sequence in which a film is formed under non-plasma conditions, and FIG. 11B shows an example of a sequence in which a film is formed using plasma.

In the second sequence of the second embodiment, a silicon boronitride film (SiBN film) containing a borazine ring skeleton as a thin film containing silicon, nitrogen and the borazine ring skeleton, or a silicon borocarbonitride film (SiBCN film) containing a borazine ring skeleton as a thin film containing silicon, carbon, nitrogen and the borazine ring skeleton is formed on the wafer 200 by performing a cycle for a first predetermined number of times, the cycle including:

forming a silicon carbonitride layer containing chlorine (SiCN layer containing Cl) as a first layer containing silicon, a chloro group (chlorine), carbon and nitrogen by performing supplying a chlorosilane-based precursor gas containing silicon and the chloro group to the wafer 200 in the process chamber 201 and supplying an aminosilane-based precursor gas containing silicon and an amino group to the wafer 200 in the process chamber 201, for a second predetermined number of times (a plurality of times), forming a silicon borocarbonitride layer (SiBCN layer) containing the borazine ring skeleton as a second layer containing silicon, carbon, nitrogen and the borazine ring skeleton by supplying a reaction gas containing a borazine compound to the wafer 200 in the process chamber 201 and allowing the first layer to react with the borazine compound to modify the first layer under a condition in which the borazine ring skeleton in the borazine compound is maintained, and forming a silicon boronitride layer (SiBN layer) containing the borazine ring skeleton as a third layer containing silicon, nitrogen and the borazine ring skeleton, or a silicon borocarbonitride layer (SiBCN layer) containing the borazine ring skeleton as a third layer containing silicon, carbon, nitrogen and the borazine ring skeleton by supplying a nitriding gas to the wafer 200 in the process chamber 201 and nitriding the second layer to modify the second layer under a condition in which the borazine ring skeleton in the second layer is maintained.

In addition, FIGS. 9 and 11 show an example of performing supplying the chlorosilane-based precursor gas to the wafer 200 in the process chamber 201 and then supplying the aminosilane-based precursor gas to the wafer 200 in the process chamber 201, which are alternately repeated a plurality of times, i.e., an example of supplying the chlorosilane-based precursor gas prior to the aminosilane-based precursor gas, when the first layer is formed.

That is, in the second sequence, after Steps 1 and 2 of the above-described first sequence are set as one set and the set is repeated a plurality of times, Steps 3 and 4 are performed. Then, the repeated set of Steps 1 and 2 and Steps 3 and 4 are set as one cycle and the cycle is performed for a predetermined number of times, thereby forming the SiBN or SiBCN film containing the borazine ring skeleton having a predetermined composition and a predetermined film thickness on the wafer 200. FIG. 11 shows an example in which the above-described Steps 1 and 2 are set as one set and the set is performed twice before Steps 3 and 4 are performed. Then, the repeated set of Steps 1 and 2 and Steps 3 and 4 are set as one cycle, and the cycle is performed n times (n being an integer), thereby forming the SiBN or SiBCN film containing the borazine ring skeleton having a predetermined composition and a predetermined film thickness on the wafer 200. In addition, the second sequence is different from the first sequence only in that the above-described Steps 1 and 2 are set as one set and the set is repeated a plurality of times before Steps 3 and 4 are performed, and the others may be performed in the same way as the first sequence. The processing conditions of the second sequence may also be the same as the processing conditions of the above-described first sequence.

According to the second embodiment, effects similar to those of the above-described first embodiment are shown. That is, the SiBN or SiBCN film having a high resistance to hydrogen fluoride (HF) and a low dielectric constant, as compared with a conventional SiCN or SiOCN film, can be formed in a low temperature range. In other words, a thin film having the improved resistance to HF and the reduced dielectric constant, which are in a trade-off relationship, can be formed in a low temperature range.

In addition, according to the second embodiment, by performing Steps 1 to 3 to form the second layer on the wafer 200 and then by performing Step 4 of supplying the NH$_3$ gas to the wafer 200 in the process chamber 201, it is possible to more precisely control a composition ratio of the SiBN or SiBCN layer and accordingly to more precisely control a composition ratio of the SiBN or SiBCN film.

Also, according to the second embodiment, impurities such as Cl can be more desorbed (extracted) from the second layer having a low impurity concentration by allowing the second layer to react with the thermally activated NH$_3$ gas or the active species obtained by plasma-exciting the NH$_3$ gas in Step 4, thereby obtaining the third layer having a lower impurity content. Accordingly, since an impurity concentration in the SiBN or SiBCN film formed by performing the cycle including Steps 1 to 4 for a predetermined number of times can be more lowered, the resistance to HF of the SiBN or SiBCN film can be more improved.

According to the embodiment, since when the first layer containing Cl (SiCN layer containing Cl) is modified to form the second layer (SiBCN layer) by supplying the alkylborazine compound such as TMB to the first layer containing Cl in Step 3, the borazine ring skeleton constituting the borazine ring contained in the borazine compound is maintained without being broken, the central space of the borazine ring can be maintained and thus the second layer can be made porous. In addition, as the borazine ring skeleton constituting the borazine ring contained in the second layer is maintained without being broken when the second layer is modified to form the third layer (SiBN or SiBCN layer), the central space of the borazine ring can be maintained and thus the third layer can be made porous. Accordingly, since the SiBN or SiBCN film formed by performing the cycle including Steps 1 to 4 for a predetermined number of times can be made porous, it is possible to more reduce the dielectric constant of the SiBN or SiBCN film. That is, it is possible to form a low dielectric constant film (low-k film) having a porous structure and having extremely low dielectric constant.

(Modification Examples)

In the above-described Step 4, the second layer is modified using a nitriding gas to adjust a nitrogen component and a carbon component of the second layer. That is, the respective components are adjusted such that the nitrogen component of the second layer is increased and the carbon component thereof is decreased. However, the embodiment is not limited thereto. For example, a reaction gas containing carbon (C) and nitrogen (N) may be used instead of the nitriding gas. That is, in the above-described Step 4, the third layer may be formed in such a manner that the wafer 200 is supplied with a reaction gas containing carbon and nitrogen, the second layer is allowed to react with the reaction gas to modify the second layer under a condition in which the borazine ring skeleton in the second layer is maintained, and a nitrogen component and a carbon component of the second layer are adjusted.

In this case, since nitrogen and carbon contained in the reaction gas can be added to the second layer, it is possible to respectively increase a nitrogen component and a carbon component of the modified second layer, i.e., the third layer. That is, the third layer becomes not a SiBN layer but a SiBCN layer having the increased (adjusted) nitrogen and carbon components, and not a SiBN film but a SiBCN film is formed on the wafer 200. In addition, since the reaction gas containing carbon and nitrogen is not plasma-excited but thermally activated to be supplied, an effect of desorbing (extracting) the carbon component from the second layer can be relieved, thereby making it easy to control the ratio of the carbon component of the third layer, i.e., the ratio of the carbon component of the SiBCN film to be increased.

Amine-based gas may be used as the reaction gas containing carbon and nitrogen. In addition, the amine-based gas is a gas containing an amine group such as a gas obtained by vaporizing amine and is a gas at least containing carbon (C), nitrogen (N) and hydrogen (H). The amine-based gas includes amine such as ethylamine, methylamine, propylamine, isopropylamine, butylamine, and isobutylamine. Here, the amine is a generic name of a compound in which one or more hydrogen atoms of ammonia ($NH_3$) are substitute with a hydrocarbon group such as an alkyl group. That is, the amine includes a hydrocarbon group such as an alkyl group. The amine-based gas may be referred to as silicon-free gas in that the amine-based gas does not contain silicon (Si). Furthermore, the amine-based gas may also be referred to as silicon-free and metal-free gas in that the amine-based gas does not contain silicon and metal.

The amine-based gas may include, for example, ethylamine-based gas obtained by vaporizing triethylamine (($C_2H_5$)$_3$N, abbreviated to TEA), diethylamine (($C_2H_5$)$_2$NH, abbreviated to DEA), monoethylamine ($C_2H_5NH_2$, abbreviated to MEA) or the like; methylamine-based gas obtained by vaporizing trimethylamine (($CH_3$)$_3$N, abbreviated to TMA), dimethylamine (($CH_3$)$_2$NH, abbreviated to DMA), monomethylamine ($CH_3NH_2$, abbreviated to MMA) or the like; propylamine-based gas obtained by vaporizing tripropylamine (($C_3H_7$)$_3$N, abbreviated to TPA), dipropylamine (($C_3H_7$)$_2$NH, abbreviated to DPA), monopropylamine ($C_3H_7NH_2$, abbreviated to MPA) or the like; isopropylamine-based gas obtained by vaporizing triisopropylamine ([($CH_3$)$_2$CH]$_3$N, abbreviated to TIPA), diisopropylamine ([($CH_3$)$_2$CH]$_2$NH, abbreviated to DIPA), monoisopropylamine (($CH_3$)$_2$CHNH$_2$, abbreviated to MIPA) or the like; butylamine-based gas obtained by vaporizing tributylamine (($C_4H_9$)$_3$N, abbreviated to TBA), dibutylamine (($C_4H_9$)$_2$NH, abbreviated to DBA), monobutylamine ($C_4H_9NH_2$, abbreviated to MBA) or the like; and isobutylamine-based gas obtained by vaporizing triisobutylamine ([($CH_3$)$_2$CHCH$_2$]$_3$N, abbreviated to TIBA), diisobutylamine ([($CH_3$)$_2$CHCH$_2$]$_2$NH, abbreviated to DIBA), monoisobutylamine (($CH_3$)$_2$CHCH$_2$NH$_2$, abbreviated to MIBA) or the like. That is, the amine-based gas may preferably include, for example, at least one of ($C_2H_5$)$_x$NH$_{3-x}$, ($CH_3$)$_x$NH$_{3-x}$, ($C_3H_7$)$_x$NH$_{3-x}$, [($CH_3$)$_2$CH]$_x$NH$_{3-x}$, ($C_4H_9$)$_x$NH$_{3-x}$, [($CH_3$)$_2$CHCH$_2$]$_x$NH$_{3-x}$ (x is an integer from 1 to 3 in the chemical formulae). In addition, for example, when amine in a liquid state under normal temperature and pressure, such as TEA, is used, the amine in a liquid state is vaporized by a vaporization system, such as a vaporizer or a bubbler, and supplied as the amine-based gas, i.e., a reaction gas containing a borazine compound (TEA gas).

The amine-based gas acts as not only a nitrogen source but also a carbon source. As the amine-based gas is used as the reaction gas containing carbon and nitrogen, it is easy to control the ratios of the carbon and nitrogen components of the SiBCN film to be increased.

In addition, gas containing an organic hydrazine compound, i.e., organic hydrazine-based gas, may be used instead of the amine-based gas. In addition, the organic hydrazine-based gas refers to gas having a hydrazine group such as gas obtained by vaporizing organic hydrazine, and only consists of three elements, i.e., a carbon (C) element, a nitrogen (N) element and a hydrogen (H) element. That is, the organic hydrazine-based gas is a silicon-free gas, and furthermore, silicon-free and metal-free gas. The organic hydrazine-based gas may include, for example, methylhydrazine-based gas obtained by vaporizing monomethylhydrazine (($CH_3$)HN$_2$H$_2$, abbreviated to MMH), dimethylhydrazine (($CH_3$)$_2$N$_2$H$_2$, abbreviated to DMH), trimethyl hydrazine (($CH_3$)$_2$N$_2$($CH_3$)H, abbreviated to TMH) or the like; and ethylhydrazine-based gas obtained by vaporizing ethylhydrazine (($C_2H_5$)HN$_2$H$_2$, abbreviated to EH) or the like. In addition, for example, when organic hydrazine in a liquid state under normal temperature and pressure, such as MMH, is used, the organic hydrazine in a liquid state is vaporized by a vaporization system, such as a vaporizer or a bubbler, and supplied as the organic hydrazine-based gas, i.e., a reaction gas containing carbon and nitrogen (MMH gas).

<Additional Embodiments of the Present Disclosure>

Hereinabove, various embodiments of the present disclosure has been specifically described, but the present disclosure is not limited to the above-described embodiments, and may be variously modified without departing from the spirit of the present disclosure.

For example, in the above-described embodiments, while an example in which the chlorosilane-based precursor is supplied to the wafer 200 in the process chamber 201 and then the aminosilane-based precursor is supplied when the first layer containing Si, Cl, C and N is formed in each sequence has been described, the supply order of the precursors may be reversed. That is, after the aminosilane-based precursor is supplied, the chlorosilane-based precursor may be supplied. That is, after one of the chlorosilane-based precursor and the aminosilane-based precursor is supplied, the other precursor may be supplied. In this way, as the supply order of the precursors is changed, film quality or a composition ratio of the thin film formed in each sequence can be varied.

In addition, for example, as not only the supply order of the chlorosilane-based precursor and the aminosilane-based precursor but also the supply order of all the gases including the chlorosilane-based precursor and the aminosilane-based precursor may be changed, film quality or a composition ratio of the thin film formed in each sequence can be varied.

Also, in the above-described embodiments, while an example in which the chlorosilane-based precursor and the aminosilane-based precursor are used when the first layer is formed in each sequence has been described, instead of the chlorosilane-based precursor, a silane-based precursor having a halogen-based ligand other than the chlorosilane-based precursor may be used. For example, a fluorosilane-based precursor may be used instead of chlorosilane-based precursor. Here, the fluorosilane-based precursor refers to a silane-based precursor having a fluoro group as a halogen group, and is a precursor at least including silicon (Si) and fluorine (F). The fluorosilane-based precursor gas may include, for example, silicon fluoride gas such as tetrafluorosilane, i.e., silicon tetrafluoride ($SiF_4$) gas, or hexafluoro disilane ($Si_2F_6$) gas. In this case, when the first layer is formed in each sequence, the wafer 200 in the process chamber 201 is supplied with the fluorosilane-based precursor and then the aminosilane-based precursor, or supplied with the aminosilane-based precursor and then the fluorosilane-based precursor. In this case, the first layer becomes a layer containing Si, F, C and N (SiCN layer containing F).

Further, in the above-described embodiments, while an example in which the wafer 200 in the process chamber 201 is supplied with the chlorosilane-based precursor and then the aminosilane-based precursor when the first layer containing Si, Cl, C and N is formed in each sequence has been described, the chlorosilane-based precursor and the aminosilane-based precursor may be simultaneously supplied to the wafer 200 in the process chamber 201 to cause CVD reaction.

That is, a silicon borocarbonitride film (SiBCN film) containing a borazine ring skeleton as a thin film containing silicon, carbon, nitrogen and the borazine ring skeleton may be formed on a wafer 200 by performing a cycle for a predetermined number of times, the cycle including:

forming a silicon carbonitride layer containing chlorine (SiCN layer containing CO as a first layer containing silicon, a chloro group (chlorine), carbon and nitrogen by simultaneously supplying a chlorosilane-based precursor gas (HCDS gas) and an aminosilane-based precursor gas (3DMAS gas) to the wafer 200 in the process chamber 201, forming a silicon borocarbonitride layer (SiBCN layer) containing the borazine ring skeleton as a second layer containing silicon, carbon, nitrogen and the borazine ring skeleton by supplying a reaction gas containing a borazine compound (TMB gas) to the wafer 200 in the process chamber 201 and allowing the first layer to react with the borazine compound to modify the first layer under a condition in which the borazine ring skeleton in the borazine compound is maintained.

In addition, a silicon boronitride film (SiBN film) containing a borazine ring skeleton as a thin film containing silicon, nitrogen and a borazine ring skeleton, or a silicon borocarbonitride film (SiBCN film) containing a borazine ring skeleton as a thin film containing silicon, carbon, nitrogen and the borazine ring skeleton may be formed on a wafer 200 by performing a cycle for a predetermined number of times, the cycle including:

forming a silicon carbonitride layer containing chlorine (SiCN layer containing Cl) as a first layer containing silicon, a chloro group (chlorine), carbon and nitrogen by simultaneously supplying a chlorosilane-based precursor gas (HCDS gas) and an aminosilane-based precursor gas (3DMAS gas) to the wafer 200 in the process chamber 201, forming a silicon borocarbonitride layer (SiBCN layer) containing the borazine ring skeleton as a second layer containing silicon, carbon, nitrogen and the borazine ring skeleton by supplying a reaction gas containing a borazine compound (TMB gas) to the wafer 200 in the process chamber 201 and allowing the first layer to react with the borazine compound to modify the first layer under a condition in which the borazine ring skeleton in the borazine compound is maintained, and forming a silicon boronitride layer (SiBN layer) containing the borazine ring skeleton as a third layer containing silicon, nitrogen and the borazine ring skeleton, or a silicon borocarbonitride layer (SiBCN layer) containing the borazine ring skeleton as a third layer containing silicon, carbon, nitrogen and the borazine ring skeleton by supplying a nitriding gas to the wafer 200 in the process chamber 201 and nitriding the second layer to modify the second layer under a condition in which the borazine ring skeleton in the second layer is maintained.

The processing conditions in these cases may also be similar to the processing conditions in each sequence of the above-described embodiments. In this way, even when the chlorosilane-based precursor and the aminosilane-based precursor are simultaneously, rather than sequentially, supplied to the wafer 200 in the process chamber 201, functional effects similar to the above-described embodiments are obtained. However, the sequential supply of the respective precursors, i.e., the alternate supply of the chlorosilane-based precursor and the aminosilane-based precursor with the purge of the process chamber 201 interposed therebetween as in the above-described embodiments can appropriately cause reaction of the chlorosilane-based source gas with the amine-based gas under a condition in which a surface reaction is dominant, and thus, controllability of film thickness can be improved.

Also, in the above-described embodiments, while an example in which in each sequence, one kind of thin film (single-layered film) is formed on a wafer in the process chamber at a time has been described, a laminated film of two or more kinds of thin films may be formed on a wafer in the process chamber at a time by appropriately combine the above-described respective sequences. For example, as the film formation sequence of the first embodiment and the film formation sequence of the second embodiment are alternately performed in-situ in the process chamber, a laminated film having the SiBCN film and the SiBN film alternately laminated may be formed.

In this way, the present disclosure may be preferably applied to formation of not only a single-layered film but also a laminated film, in which case functional effects similar to the above-described embodiments are obtained.

In addition, as the SiBN or SiBCN film formed according to the above-described embodiments may be used as a sidewall spacer, a device forming technique having a small leak current and good machinability can be provided.

Also, as the SiBN or SiBCN film formed by the method according to the above-described embodiments may be used as an etching stopper layer, a device forming technique having good machinability can be provided.

Also, according to the above-described embodiments, a SiBN or SiBCN film having an ideal stoichiometric mixture ratio can be formed without using plasma even in a low temperature region. In addition, since the SiBN or SiBCN film can be formed without using plasma, for example, application to a process having probability of plasma damage, for example, an SADP film of DPT, is also possible.

In addition, in the above-described embodiments, while an example in which the silicon-based insulating film (SiBCN or SiBN film) containing silicon, which is a semiconductor element, is formed as a borocarbonitride film or a boronitride film has been described, the present disclosure may be applied to a case in which a metal-based thin turn containing a metal element such as titanium (Ti), zirconium (Zr), hafnium (Hf), tantalum (Ta), aluminum (Al), molybdenum (Mo), or the like is formed.

For example, the present disclosure may be applied to a case in which a titanium borocarbonitride film (TiBCN film), a titanium boronitride film (TiBN film), a Ti-based thin film obtained by combining or mixing them, or a laminated film thereof is formed.

Also, for example, the present disclosure may be applied to the case in which a zirconium borocarbonitride film (ZrBCN film), a zirconium boronitride film (ZrBN film), a Zr-based thin film obtained by combining or mixing them, or a laminated film thereof is formed.

Also, for example, the present disclosure may be applied to a case in which a hafnium borocarbonitride film (HfBCN film), a hafnium boronitride film (HfBN film), a Hf-based thin film obtained by combining or mixing them, or a laminated film thereof is formed.

Further, for example, the present disclosure may be applied to a case in which a tantalum borocarbonitride film (TaBCN film), a tantalum boronitride film (TaBN film), a Ta-based thin film obtained by combining or mixing them, or a laminated film thereof is formed.

Furthermore, for example, the present disclosure may be applied to a case in which an aluminum borocarbonitride film (AlBCN film), an aluminum boronitride film (AlBN film), an Al-based thin film obtained by combining or mixing them, or a laminated film thereof is formed.

Moreover, for example, the present disclosure may be applied to a case in which a molybdenum borocarbonitride film (MoBCN film), a molybdenum boronitride film (MoBN film), a Mo-based thin film obtained by combining or mixing them, or a laminated film thereof is formed.

In this case, using a precursor (first precursor) containing a metal element and a halogen group instead of the chlorosilane-based precursor of the above-described embodiments and using a precursor (second precursor) containing the metal element and an amino group instead of the aminosilane-based precursor, film formation may be performed in the same sequence as the above-described embodiments. For example, a precursor containing a metal element and a chloro group, or a precursor containing a metal element and a fluoro group may be used as the first precursor.

That is, in this case, a metal-based thin film containing a metal element, carbon, nitrogen and a borazine ring skeleton is formed on a wafer 200 by performing a cycle for a first predetermined number of times, the cycle including:

forming a first layer containing the metal element, a halogen group, carbon and nitrogen by performing supplying a first precursor gas containing the metal element and the halogen group to the wafer 200 in the process chamber 201 and supplying a second precursor gas containing the metal element and an amino group to the wafer 200 in the process chamber 201, for a second predetermined number of times (once or more), and forming a second layer containing the metal element, carbon, nitrogen and the borazine ring skeleton by supplying a reaction gas containing a borazine compound to the wafer 200 in the process chamber 201 and allowing the first layer to react with the borazine compound to modify the first layer under a condition in which the borazine ring skeleton in the borazine compound is maintained.

In addition, a metal-based thin film containing a metal element, nitrogen and a borazine ring skeleton, or a metal-based thin film containing a metal element, carbon, nitrogen and a borazine ring skeleton may be formed on the wafer 200 by performing a cycle for a first predetermined number of times, the cycle including:

forming a first layer containing the metal element, a halogen group, carbon and nitrogen by performing supplying a first precursor gas containing the metal element and the halogen group to the wafer 200 in the process chamber 201 and supplying a second precursor gas containing the metal element and an amino group to the wafer 200 in the process chamber 201, for a second predetermined number of times (once or more), forming a second layer containing the metal element, carbon, nitrogen and the borazine ring skeleton by supplying a reaction gas containing a borazine compound to the wafer 200 in the process chamber 201 and allowing the first layer to react with the borazine compound to modify the first layer under a condition in which the borazine ring skeleton in the borazine compound is maintained, and forming a third layer containing the metal element, nitrogen and the borazine ring skeleton, or a third layer containing the metal element, carbon, nitrogen and the borazine ring skeleton by supplying a nitriding gas to the wafer 200 in the process chamber 201 and nitriding the second layer to modify the second layer under a condition in which the borazine ring skeleton in the second layer is maintained.

For example, when a Ti-based thin film is formed as the metal-based thin film, a precursor containing Ti and a chloro group such as titanium tetrachloride ($TiCl_4$), or a precursor containing Ti and a fluoro group such as titanium tetrafluoride ($TiF_4$) may be used as the first precursor. A precursor containing Ti and an amino group such as tetrakis(ethylmethylamino)titanium ($Ti[N(C_2H_5)(CH_3)]_4$, abbreviated to TEMAT), tetrakis(dimethylamino)titanium ($Ti[N(CH_3)_2]_4$, abbreviated to TDMAT), or tetrakis(diethylamino)titanium ($Ti[N(C_2H_5)_2]_4$, abbreviated to TDEAT) may be used as the second precursor. The same gas as the above-described embodiments may be used as the reaction gas containing the borazine compound or the nitriding gas. Also, in this case, processing conditions may be similar to the above-described embodiments, for example.

For example, when a Zr-based thin film is formed as the metal-based thin film, a precursor containing Zr and a chloro group such as zirconium tetrachloride ($ZrCl_4$), or a precursor containing Zr and a fluoro group such as zirconium tetrafluoride ($ZrF_4$) may be used as the first precursor. A precursor containing Zr and an amino group such as tetrakis(ethylmethylamino)zirconium ($Zr[N(C_2H_5)(CH_3)]_4$, abbreviated to TEMAZ), tetrakis(methylamino)zirconium ($Zr[N(CH_3)_2]_4$, abbreviated to TDMAZ), or tetrakis(diethylamino)zirconium ($Zr[N(C_2H_5)_2]_4$, abbreviated to TDEAZ) may be used as the second precursor. The same gas as the above-described embodiments may be used as the reaction gas containing the borazine compound or the nitriding gas. Also, in this case, processing conditions may be similar to the above-described embodiments, for example.

For example, when a Hf-based thin film is formed as the metal-based thin film, a precursor containing Hf and a chloro group such as hafnium tetrachloride ($HfCl_4$), or a precursor containing Hf and a fluoro group such as hafnium tetrafluoride ($HfF_4$) may be used as the first precursor. A precursor containing Hf and an amino group such as tetrakis(ethylmethylamino)hafnium ($Hf[N(C_2H_5)(CH_3)]_4$, abbreviated to TEMAH), tetrakis(dimethylamino)hafnium ($Hf[N(CH_3)_2]_4$, abbreviated to TDMAH), or tetrakis(diethylamino)hafnium ($Hf[N(C_2H_5)_2]_4$, abbreviated to TDEAH) may be used as the second precursor. The same gas as the above-described embodiments may be used as the reaction gas containing the borazine compound or the nitriding gas. Also, in this case, processing conditions may be similar to the above-described embodiments, for example.

As described above, the present disclosure may also be applied to formation of not only the silicon-based thin film but also the metal-based thin film, in which case functional effects similar to the above-described embodiments are obtained.

That is, the present disclosure may be applied to a case in which the thin film containing a predetermined element such as a semiconductor element or a metal element is formed.

Moreover, while an example in which the thin film is formed using a batch type substrate processing apparatus in which a plurality of substrates are processed at a time has been described, the present disclosure is not limited thereto but may be applied to a case in which the thin film is formed using a single-wafer type substrate processing apparatus in which one or several substrates are processed at a time.

Moreover, the above-described embodiments, modifications, application examples and the like may be appropriately combined and used.

In addition, the present disclosure may be implemented by modifying, for example, an existing process recipe of the substrate processing apparatus. When the process recipe is modified, the process recipe according to the present disclosure may be installed to the substrate processing apparatus through an electrical communication line or a recording medium in which the process recipe is recorded, or the process recipe itself may be changed to the process recipe according to the present disclosure by manipulating an input/output device of the substrate processing apparatus.

<Further Additional Aspects of the Present Disclosure>

Hereinafter, some aspects of the present disclosure will be additionally stated.

According to an aspect of the present disclosure, there is provided a method of manufacturing a semiconductor device, including forming a thin film containing a predetermined element, carbon, nitrogen and a borazine ring skeleton on a substrate by performing a cycle for a first predetermined number of times, the cycle including: forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times; and forming a second layer containing the predetermined element, carbon, nitrogen and the borazine ring skeleton by supplying a reaction gas containing a borazine compound to the substrate and allowing the first layer to react with the borazine compound to modify the first layer under a condition in which the borazine ring skeleton in the borazine compound is maintained.

In some embodiments, in the act of forming the second layer, the halogen group contained in the first layer is allowed to react with a ligand contained in the borazine compound.

In some embodiments, in the act of forming the second layer, the halogen group contained in the first layer is allowed to react with a ligand contained in the borazine compound to separate (extract) the halogen group reacted with the ligand from the first layer and separate the ligand reacted with the halogen group from the borazine compound.

In some embodiments, in the act of forming the second layer, the halogen group contained in the first layer is allowed to react with a ligand contained in the borazine compound to separate (extract) the halogen group reacted with the ligand from the first layer and separate the ligand reacted with the halogen group from the borazine compound, thereby bonding the borazine compound with the ligand separated therefrom and the predetermined element contained in the first layer.

In some embodiments, in the act of forming the second layer, the halogen group contained in the first layer is allowed to react with a ligand contained in the borazine compound to separate (extract) the halogen group reacted with the ligand from the first layer and separate the ligand reacted with the halogen group from the borazine compound, thereby bonding a portion of a borazine ring of the borazine compound with the ligand separated therefrom and the predetermined element contained in the first layer.

In some embodiments, in the act of forming the second layer, the halogen group contained in the first layer is allowed to react with a ligand contained in the borazine compound to separate (extract) the halogen group reacted with the ligand from the first layer and separate the ligand reacted with the halogen group from the borazine compound, thereby bonding nitrogen constituting a borazine ring of the borazine compound with the ligand separated therefrom and the predetermined element contained in the first layer.

In some embodiments, the act of forming the second layer is performed under a condition in which the halogen group contained in the first layer is allowed to react with a ligand contained in the borazine compound.

In some embodiments, the act of forming the second layer is performed under a condition in which the halogen group contained in the first layer is allowed to react with a ligand contained in the borazine compound to separate (extract) the halogen group reacted with the ligand from the first layer and separate the ligand reacted with the halogen group from the borazine compound.

In some embodiments, the act of forming the second layer is performed under a condition in which the halogen group contained in the first layer is allowed to react with a ligand contained in the borazine compound to separate (extract) the halogen group reacted with the ligand from the first layer and separate the ligand reacted with the halogen group from the borazine compound, thereby bonding the borazine compound with the ligand separated therefrom and the predetermined element contained in the first layer.

In some embodiments, the act of forming the second layer is performed under a condition in which the halogen group contained in the first layer is allowed to react with a ligand contained in the borazine compound to separate (extract) the halogen group reacted with the ligand from the first layer and separate the ligand reacted with the halogen group from the borazine compound, thereby bonding a portion of a borazine ring of the borazine compound with the ligand separated therefrom and the predetermined element contained in the first layer.

In some embodiments, the act of forming the second layer is performed under a condition in which the halogen group contained in the first layer is allowed to react with a ligand contained in the borazine compound to separate (extract) the halogen group reacted with the ligand from the first layer and separate the ligand reacted with the halogen group from the borazine compound, thereby bonding nitrogen constituting a borazine ring of the borazine compound with the ligand separated therefrom and the predetermined element contained in the first layer.

In some embodiments, in the act of forming the second layer, a temperature of the substrate is set to such a temperature that the halogen group contained in the first layer is allowed to react with a ligand contained in the borazine compound.

In some embodiments, in the act of forming the second layer, a temperature of the substrate is set to such a temperature that the halogen group contained in the first layer is allowed to react with a ligand contained in the borazine compound to separate (extract) the halogen group reacted with the ligand from the first layer and separate the ligand reacted with the halogen group from the borazine compound.

In some embodiments, in the act of forming the second layer, a temperature of the substrate is set to such a temperature that the halogen group contained in the first layer is allowed to react with a ligand contained in the borazine compound to separate (extract) the halogen group reacted with the ligand from the first layer and separate the ligand reacted with the halogen group from the borazine compound, thereby bonding the borazine compound with the ligand separated therefrom and the predetermined element contained in the first layer.

In some embodiments, in the act of forming the second layer, a temperature of the substrate is set to such a temperature that the halogen group contained in the first layer is allowed to react with a ligand contained in the borazine compound to separate (extract) the halogen group reacted with the ligand from the first layer and separate the ligand reacted with the halogen group from the borazine compound, thereby bonding a portion of a borazine ring of the borazine compound with the ligand separated therefrom and the predetermined element contained in the first layer.

In some embodiments, in the act of forming the second layer, a temperature of the substrate is set to such a temperature that the halogen group contained in the first layer is allowed to react with a ligand contained in the borazine compound to separate (extract) the halogen group reacted with the ligand from the first layer and separate the ligand reacted with the halogen group from the borazine compound, thereby bonding nitrogen constituting a borazine ring of the borazine compound with the ligand separated therefrom and the predetermined element contained in the first layer.

In some embodiments, the cycle further includes modifying the second layer and adjusting nitrogen and carbon components of the second layer by supplying a nitriding gas to the substrate and nitriding the second layer under a condition in which the borazine ring skeleton in the second layer is maintained.

In some embodiments, the cycle further includes modifying the second layer and adjusting nitrogen and carbon components of the second layer by supplying a reaction gas containing carbon and nitrogen to the substrate under a condition in which the borazine ring skeleton in the second layer is maintained.

In some embodiments, the cycle further includes forming a third layer containing the predetermined element, nitrogen and the borazine ring skeleton, or a third layer containing the predetermined element, carbon, nitrogen and the borazine ring skeleton by supplying a nitriding gas to the substrate and nitriding the second layer to modify the second layer under a condition in which the borazine ring skeleton in the second layer is maintained, and in the act of forming the thin film, a thin film containing the predetermined element, nitrogen and the borazine ring skeleton, or a thin film containing the predetermined element, carbon, nitrogen and the borazine ring skeleton is formed on the substrate.

According to another aspect of the present disclosure, there is provided a method of manufacturing a semiconductor device, including forming a thin film containing a predetermined element, nitrogen and a borazine ring skeleton, or a thin film containing a predetermined element, carbon, nitrogen and a borazine ring skeleton on a substrate by performing a cycle for a first predetermined number of times, the cycle including: forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times; forming a second layer containing the predetermined element, carbon, nitrogen and the borazine ring skeleton by supplying a reaction gas containing a borazine compound to the substrate and allowing the first layer to react with the borazine compound to modify the first layer under a condition in which the borazine ring skeleton in the borazine compound is maintained; and forming a third layer containing the predetermined element, nitrogen and the borazine ring skeleton, or a third layer containing the predetermined element, carbon, nitrogen and the borazine ring skeleton by supplying a nitriding gas to the substrate and nitriding the second layer to modify the second layer under a condition in which the borazine ring skeleton in the second layer is maintained.

In some embodiments, in the act of forming the third layer, carbon contained in the second layer is at least partially separated (extracted) from the second layer.

In some embodiments, the act of forming the third layer is performed under a condition in which carbon contained in the second layer is at least partially separated (extracted) from the second layer.

In some embodiments, in the act of forming the third layer, a temperature of the substrate is set to such a temperature that carbon contained in the second layer is at least partially separated (extracted) from the second layer.

In some embodiments, in the act of forming the first layer, the act of supplying the first precursor gas and the act of supplying the second precursor gas are alternately performed for the second predetermined number of times.

In some embodiments, in the act of forming the first layer, the act of supplying the first precursor gas and the act of supplying the second precursor gas are set as one set and the set is performed for the second predetermined number of times.

In some embodiments, in the act of forming the first layer, the act of supplying the first precursor gas and the act of supplying the second precursor gas are simultaneously performed for the second predetermined number of times.

In some embodiments, the predetermined element includes a semiconductor element or a metal element.

In some embodiments, the predetermined element includes a silicon element.

According to still another aspect of the present disclosure, there is provided a method of processing a substrate, including forming a thin film containing a predetermined element, carbon, nitrogen and a borazine ring skeleton on a substrate by performing a cycle for a first predetermined number of times, the cycle including: forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times; and forming a second layer containing the predetermined element, carbon, nitrogen and the borazine ring skeleton by supplying a reaction gas containing a borazine compound to the substrate and allowing the first layer to react with the borazine compound to modify the first layer under a condition in which the borazine ring skeleton in the borazine compound is maintained.

According to yet another aspect of the present disclosure, there is provided a method of processing a substrate, including forming a thin film containing a predetermined element, nitrogen and a borazine ring skeleton, or a thin film containing a predetermined element, carbon, nitrogen and a borazine ring skeleton on a substrate by performing a cycle for a first predetermined number of times, the cycle including: forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times; forming a second layer containing the predetermined element, carbon, nitrogen and the borazine ring skeleton by supplying a reaction gas containing a borazine compound to the substrate and allowing the first layer to react with the borazine compound to modify the first layer under a condition in which the borazine ring skeleton in the borazine compound is maintained; and forming a third layer containing the predetermined element, nitrogen and the borazine ring skeleton, or a third layer containing the predetermined element, carbon, nitrogen and the borazine ring skeleton by supplying a nitriding gas to the substrate and nitriding the second layer to modify the second layer under a condition in which the borazine ring skeleton in the second layer is maintained.

According to yet another aspect of the present disclosure, there is provided a substrate processing apparatus, including: a process chamber configured to accommodate a substrate; a heater configured to heat the substrate in the process chamber; a first precursor gas supply system configured to supply a first precursor gas containing a predetermined element and a halogen group to the substrate in the process chamber; a second precursor gas supply system configured to supply a second precursor gas containing the predetermined element and an amino group to the substrate in the process chamber; a reaction gas supply system configured to supply a reaction gas containing a borazine compound to the substrate in the process chamber; a pressure adjusting unit configured to adjust an internal pressure of the process chamber; and a control unit configured to control the first precursor gas supply system, the second precursor gas supply system, the reaction gas supply system, the heater and the pressure adjusting unit such that a thin film containing the predetermined element, carbon, nitrogen and a borazine ring skeleton is formed on the substrate by performing a cycle for a first predetermined number of times, the cycle including: forming a first layer containing the predetermined element, the halogen group, carbon and nitrogen by performing supplying the first precursor gas to the substrate in the process chamber and supplying the second precursor gas to the substrate in the process chamber, for a second predetermined number of times; and forming a second layer containing the predetermined element, carbon, nitrogen and the borazine ring skeleton by supplying the reaction gas to the substrate in the process chamber and allowing the first layer to react with the borazine compound to modify the first layer under a condition in which the borazine ring skeleton in the borazine compound is maintained.

According to yet another aspect of the present disclosure, there is provided a substrate processing apparatus, including: a process chamber configured to accommodate a substrate; a heater configured to heat the substrate in the process chamber; a first precursor gas supply system configured to supply a first precursor gas containing a predetermined element and a halogen group to the substrate in the process chamber; a second precursor gas supply system configured to supply a second precursor gas containing the predetermined element and an amino group to the substrate in the process chamber; a reaction gas supply system configured to supply a reaction gas containing a borazine compound to the substrate in the process chamber; a nitriding gas supply system configured to supply a nitriding gas to the substrate in the process chamber; a pressure adjusting unit configured to adjust an internal pressure of the process chamber; and a control unit configured to control the first precursor gas supply system, the second precursor gas supply system, the reaction gas supply system, the nitriding gas supply system, the heater and the pressure adjusting unit such that a thin film containing the predetermined element, nitrogen and a borazine ring skeleton, or a thin film containing the predetermined element, carbon, nitrogen and a borazine ring skeleton is formed on the substrate by performing a cycle for a first predetermined number of times, the cycle including: forming a first layer containing the predetermined element, the halogen group, carbon and nitrogen by performing supplying the first precursor gas to the substrate in the process chamber and supplying the second precursor gas to the substrate in the process chamber, for a second predetermined number of times; forming a second layer containing the predetermined element, carbon, nitrogen and the borazine ring skeleton by supplying the reaction gas to the substrate in the process chamber and allowing the first layer to react with the borazine compound to modify the first layer under a condition in which the borazine ring skeleton in the borazine compound is maintained; and forming a third layer containing the predetermined element, nitrogen and the borazine ring skeleton, or a third layer containing the predetermined element, carbon, nitrogen and the borazine ring skeleton by supplying a nitriding gas to the substrate in the process chamber and nitriding the second layer to modify the second layer under a condition in which the borazine ring skeleton in the second layer is maintained.

According to yet another aspect of the present disclosure, there is provided a program causing a computer to perform a process of forming a thin film containing a predetermined element, carbon, nitrogen and a borazine ring skeleton on a substrate in a process chamber of a substrate processing apparatus by performing a cycle for a first predetermined number of times, the cycle including: forming a first layer containing the predetermined element, a halogen group, carbon and nitrogen by performing supplying a first precursor gas containing the predetermined element and the halogen group to the substrate in the process chamber and supplying a second precursor gas containing the predetermined element and an amino group to the substrate in the process chamber, for a second predetermined number of times; and forming a second layer containing the predetermined element, carbon, nitrogen and the borazine ring skeleton by supplying a reaction gas containing a borazine compound to the substrate in the process chamber and allowing the first layer to react with the borazine compound to modify the first layer under a condition in which the borazine ring skeleton in the borazine compound is maintained.

According to yet another aspect of the present disclosure, there is provided a program causing a computer to perform a process of forming a thin film containing a predetermined element, nitrogen and a borazine ring skeleton, or a thin film containing a predetermined element, carbon, nitrogen and a borazine ring skeleton on a substrate in a process chamber of a substrate processing apparatus by performing a cycle for a first predetermined number of times, the cycle including: forming a first layer containing the predetermined element, a halogen group, carbon and nitrogen by performing supplying a first precursor gas containing the predetermined element and the halogen group to the substrate in the process chamber and supplying a second precursor gas containing the predetermined element and an amino group to the substrate in the process chamber, for a second predetermined number of times; forming a second layer containing the predetermined element, carbon, nitrogen and the borazine ring skeleton by supplying a reaction gas containing a borazine compound to the substrate in the process chamber and allowing the first layer to react with the borazine compound to modify the first layer under a condition in which the borazine ring skeleton in the borazine compound is maintained; and forming a third layer containing the predetermined element, nitrogen and the borazine ring skeleton, or a third layer containing the predetermined element, carbon, nitrogen and the borazine ring skeleton by supplying a nitriding gas to the substrate in the process chamber and nitriding the second layer to modify the second layer under a condition in which the borazine ring skeleton in the second layer is maintained.

According to yet another aspect of the present disclosure, there is provided a non-transitory computer-readable recording medium storing a program that causes a computer to perform a process of forming a thin film containing a predetermined element, carbon, nitrogen and a borazine ring skeleton on a substrate in a process chamber of a substrate processing apparatus by performing a cycle for a first predetermined number of times, the cycle including: forming a first layer containing the predetermined element, a halogen group, carbon and nitrogen by performing supplying a first precursor gas containing the predetermined element and the halogen group to the substrate in the process chamber and supplying a second precursor gas containing the predetermined element and an amino group to the substrate in the process chamber, for a second predetermined number of times; and forming a second layer containing the predetermined element, carbon, nitrogen and the borazine ring skeleton by supplying a reaction gas containing a borazine compound to the substrate in the process chamber and allowing the first layer to react with the borazine compound to modify the first layer under a condition in which the borazine ring skeleton in the borazine compound is maintained.

According to yet another aspect of the present disclosure, there is provided a non-transitory computer-readable recording medium storing a program that causes a computer to perform a process of forming a thin film containing a predetermined element, nitrogen and a borazine ring skeleton, or a thin film containing a predetermined element, carbon, nitrogen and a borazine ring skeleton on a substrate in a process chamber of a substrate processing apparatus by performing a cycle for a first predetermined number of times, the cycle including: forming a first layer containing the predetermined element, a halogen group, carbon and nitrogen by performing supplying a first precursor gas containing the predetermined element and the halogen group to the substrate in the process chamber and supplying a second precursor gas containing the predetermined element and an amino group to the substrate in the process chamber, for a second predetermined number of times; forming a second layer containing the predetermined element, carbon, nitrogen and the borazine ring skeleton by supplying a reaction gas containing a borazine compound to the substrate in the process chamber and allowing the first layer to react with the borazine compound to modify the first layer under a condition in which the borazine ring skeleton in the borazine compound is maintained; and forming a third layer containing the predetermined element, nitrogen and the borazine ring skeleton, or a third layer containing the predetermined element, carbon, nitrogen and the borazine ring skeleton by supplying a nitriding gas to the substrate and nitriding the second layer to modify the second layer under a condition in which the borazine ring skeleton in the second layer is maintained.

According to the present disclosure, there may be provided a method of manufacturing a semiconductor device, a substrate processing apparatus, and a recording medium, which make it possible to form a thin film having a high resistance to HF and a low dielectric constant in a low temperature range.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising forming a thin film containing a predetermined element, carbon, nitrogen and a borazine ring skeleton on a substrate by performing a cycle for a first predetermined number of times, the cycle comprising:

forming a first layer containing the predetermined element, a halogen group, carbon and nitrogen by performing supplying a first precursor gas containing the predetermined element and the halogen group to the substrate and supplying a second precursor gas containing the predetermined element and an amino group to the substrate, for a second predetermined number of times; and forming a second layer containing the predetermined element, carbon, nitrogen and the borazine ring skeleton by supplying a reaction gas containing a borazine compound to the substrate and allowing the first layer to react with the borazine compound to modify the first layer under a condition in which the borazine ring skeleton in the borazine compound is maintained.

2. The method of claim 1, wherein in the act of forming the second layer, the halogen group contained in the first layer is reacted with a ligand contained in the borazine compound.

3. The method of claim 1, wherein in the act of forming the second layer, the halogen group contained in the first layer is reacted with a ligand contained in the borazine compound to separate the halogen group reacted with the ligand from the first layer and separate the ligand reacted with the halogen group from the borazine compound.

4. The method of claim 1, wherein in the act of forming the second layer, the halogen group contained in the first layer is reacted with a ligand contained in the borazine compound to separate the halogen group reacted with the ligand from the first layer and separate the ligand reacted with the halogen group from the borazine compound, thereby bonding the borazine compound with the ligand separated therefrom and the predetermined element contained in the first layer.

5. The method of claim 1, wherein in the act of forming the second layer, the halogen group contained in the first layer is reacted with a ligand contained in the borazine compound to separate the halogen group reacted with the ligand from the first layer and separate the ligand reacted with the halogen group from the borazine compound, thereby bonding a portion of a borazine ring of the borazine compound with the ligand separated therefrom and the predetermined element contained in the first layer.

6. The method of claim 1, wherein in the act of forming the second layer, the halogen group contained in the first layer is reacted with a ligand contained in the borazine compound to separate the halogen group reacted with the ligand from the first layer and separate the ligand reacted with the halogen group from the borazine compound, thereby bonding nitrogen constituting a borazine ring of the borazine compound with the ligand separated therefrom and the predetermined element contained in the first layer.

7. The method of claim 1, wherein the cycle further comprises modifying the second layer and adjusting nitrogen and carbon components of the second layer by supplying a nitriding gas to the substrate and nitriding the second layer under a condition in which the borazine ring skeleton in the second layer is maintained.

8. The method of claim 1, wherein the cycle further comprises modifying the second layer and adjusting nitrogen and carbon components of the second layer by supplying a reaction gas containing carbon and nitrogen to the substrate under a condition in which the borazine ring skeleton in the second layer is maintained.

9. The method of claim 1, wherein the cycle further comprises forming a third layer containing the predetermined element, nitrogen and the borazine ring skeleton, or a third layer containing the predetermined element, carbon, nitrogen and the borazine ring skeleton by supplying a nitriding gas to the substrate and nitriding the second layer to modify the second layer under a condition in which the borazine ring skeleton in the second layer is maintained,
wherein in the act of forming the thin film, a thin film containing the predetermined element, nitrogen and the borazine ring skeleton, or a thin film containing the predetermined element, carbon, nitrogen and the borazine ring skeleton is formed on the substrate.

10. The method of claim 9, wherein in the act of forming the third layer, carbon contained in the second layer is at least partially separated from the second layer.

11. The method of claim 1, wherein in the act of forming the first layer, the act of supplying the first precursor gas and the act of supplying the second precursor gas are alternately performed for the second predetermined number of times.

12. The method of claim 1, wherein in the act of forming the first layer, the act of supplying the first precursor gas and the act of supplying the second precursor gas are set as one set and the set is performed for the second predetermined number of times.

13. The method of claim 1, wherein in the act of forming the first layer, the act of supplying the first precursor gas and the act of supplying the second precursor gas are simultaneously performed for the second predetermined number of times.

14. The method of claim 1, wherein the predetermined element comprises a semiconductor element or a metal element.

15. The method of claim 1, wherein the predetermined element comprises a silicon element.

16. A substrate processing apparatus, comprising:
a process chamber configured to accommodate a substrate;
a heater configured to heat the substrate in the process chamber;
a first precursor gas supply system configured to supply a first precursor gas containing a predetermined element and a halogen group to the substrate in the process chamber;
a second precursor gas supply system configured to supply a second precursor gas containing the predetermined element and an amino group to the substrate in the process chamber;
a reaction gas supply system configured to supply a reaction gas containing a borazine compound to the substrate in the process chamber;
a pressure adjusting unit configured to adjust an internal pressure of the process chamber; and
a control unit configured to control the first precursor gas supply system, the second precursor gas supply system, the reaction gas supply system, the heater and the pressure adjusting unit such that a thin film containing the predetermined element, carbon, nitrogen and a borazine ring skeleton is formed on the substrate by performing a cycle for a first predetermined number of times, the cycle comprising:
forming a first layer containing the predetermined element, the halogen group, carbon and nitrogen by performing supplying the first precursor gas to the substrate in the process chamber and supplying the second precursor gas to the substrate in the process chamber, for a second predetermined number of times; and
forming a second layer containing the predetermined element, carbon, nitrogen and the borazine ring skeleton by supplying the reaction gas to the substrate in the process chamber and allowing the first layer to react with the borazine compound to modify the first layer under a condition in which the borazine ring skeleton in the borazine compound is maintained.

17. A non-transitory computer-readable recording medium storing a program that causes a computer to perform a process of forming a thin film containing a predetermined element, carbon, nitrogen and a borazine ring skeleton on a substrate in a process chamber of a substrate processing apparatus by performing a cycle for a first predetermined number of times, the cycle comprising:
forming a first layer containing the predetermined element, a halogen group, carbon and nitrogen by performing supplying a first precursor gas containing the predetermined element and the halogen group to the substrate in the process chamber and supplying a second precursor gas containing the predetermined element and an amino group to the substrate in the process chamber, for a second predetermined number of times; and
forming a second layer containing the predetermined element, carbon, nitrogen and the borazine ring skeleton by supplying a reaction gas containing a borazine compound to the substrate in the process chamber and allowing the first layer to react with the borazine compound to modify the first layer under a condition in which the borazine ring skeleton in the borazine compound is maintained.

* * * * *